United States Patent
Billman

(10) Patent No.: US 7,283,166 B1
(45) Date of Patent: Oct. 16, 2007

(54) AUTOMATIC CONTROL METHOD AND SYSTEM FOR ELECTRON BOMBARDED CHARGE COUPLED DEVICE ("EBCCD") SENSOR

(75) Inventor: Kenneth William Billman, Mountain View, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 926 days.

(21) Appl. No.: 10/441,676

(22) Filed: May 19, 2003

Related U.S. Application Data

(60) Provisional application No. 60/418,183, filed on Oct. 15, 2002.

(51) Int. Cl.
*H04N 5/20* (2006.01)
*H04N 3/14* (2006.01)
*H04N 5/335* (2006.01)
*H01J 31/50* (2006.01)

(52) U.S. Cl. .............. 348/255; 348/311; 250/214 VT

(58) Field of Classification Search ......... 250/214 VT, 250/208.1; 348/229.1, 230.1, 255, 294, 297, 348/311; 257/222
See application file for complete search history.

(56) References Cited

U.S. PATENT DOCUMENTS

| | | | | |
|---|---|---|---|---|
| 4,636,980 | A | * | 1/1987 | Bluzer ....................... 348/294 |
| 5,401,951 | A | * | 3/1995 | Butler et al. .......... 250/214 VT |
| 5,650,643 | A | * | 7/1997 | Konuma ..................... 348/294 |
| 5,867,215 | A | * | 2/1999 | Kaplan ....................... 348/310 |
| 7,157,680 | B2 | * | 1/2007 | Suhling ................ 250/214 VT |
| 2002/0093288 | A1 | * | 7/2002 | Spencer et al. ............. 313/523 |

* cited by examiner

*Primary Examiner*—Vivek Srivastava
*Assistant Examiner*—Jason Whipkey
(74) *Attorney, Agent, or Firm*—McDermott Will & Emery LLC

(57) ABSTRACT

Automatic control method and system for EBCCD sensor. The invention relates to a novel protective method of operating the Electron Bombarded Charge Coupled Device (EBCCD), a recently developed, high sensitivity, low noise, and expensive focal plane array sensor. In particular, the invention provides a method for operation that automatically controls the EBCCD gain at a very high rate. This allows i) for sensor damage protection from too much light, ii) for extension of sensor service life by reducing gain in periods of non-use, and iii) for automatic gain adjustment to rapidly compensate for variations in scene brightness.

64 Claims, 18 Drawing Sheets

PIXEL SIGNAL COUNT ARRAY

AUTOMATIC CONTROL METHOD AND SYSTEM FOR ELECTRON BOMBARDED CHARGE COUPLED DEVICE ("EBCCD") SENSOR

CROSS-REFERENCES TO RELATED APPLICATIONS

This application claims priority to U.S. Provisional No. 60/418,183 filed Oct. 15, 2002, which is incorporated by reference herein.

STATEMENT AS TO RIGHTS TO INVENTIONS MADE UNDER FEDERALLY SPONSORED RESEARCH OR DEVELOPMENT

Not applicable

REFERENCE TO A "SEQUENCE LISTING," A TABLE, OR A COMPUTER PROGRAM LISTING APPENDIX SUBMITTED ON A COMPACT DISK

Not applicable

BACKGROUND OF THE INVENTION

The present invention relates generally to the field of sensors. More particularly, the invention provides a method and system for automatic gain control of sensors. Merely by way of example, the system has been applied to the Electron Bombarded Charge Coupled Device ("EBCCD") or other like sensor having a photo emitter that is biasable, gain control, which can be turned off and on, and way for reading out photocounts per pixel for a predetermined time. It would be recognized that the invention can be applied to other sensors that need automatic control, including sensors which can be biased to control the sensor gain.

Optical sensors have been widely used to detect signals at various wavelengths. The wavelengths may cover the ultraviolet band, the visible band, the infrared band, and others. In these bandwidths, the sensors should provide high-sensitivity and low-noise detection. To achieve the desired performance, extensive research has been conducted to design and improve optical sensors.

A type of optical sensor is the Electron Bombarded Charge Coupled Device ("EBCCD"). The EBCCD sensor can provide high-sensitivity and low-noise detection. Additionally, the EBCCD sensor can perform high-rate data transmission, and have a miniature size. Consequently, the EBCCD sensor is useful for advanced optical systems such as one in the Airborne Laser System of Lockheed Martin Corporation. As merely an example, the EBCCD sensor can be used for detecting airborne targets of a very low indication through a telescope of a moving aircraft or the like. Further details of the EBCCD sensor are provided below.

FIG. 1 is a simplified diagram for the conventional EBCCD sensor. EBCCD sensor 10 includes at least photocathode 20 and CCD focal plane array 30. CCD focal plane array 30 usually has a plurality of pixels in order for EBCCD sensor to detect incoming photons in various spatial locations.

FIG. 2 is a simplified diagram for a conventional focal plane array ("FPA") of EBCCD sensor. As shown in FIG. 2, FPA 150 may include a large number of pixels. For example, FPA 150 has 16,384 pixels, each pixel occupying a 30-μm by 30-μm area. These pixels are grouped into 16 digitized read-out regions. Each read-out region contains 1,024 pixels and contains its analog to digital converter. Signal electrons in each read-out region can be swept out simultaneously and rapidly processed in parallel. For example, pixel charges in each read-out region are digitized and serially read-out as 1024 digitized "counts" within a short, typically 50-μs period. Simultaneously, pixel charges in other read-out regions are also read out and sent for computer analysis and storage.

As discussed above, the EBCCD sensor provides high-performance detection. Unfortunately, the EBCCD still has many limitations. For example, the EBCCD sensor is often difficult and expensive to make. As compared to other types of conventional sensors, which are relatively inexpensive, the EBCCD sensor can cost tens of thousands of U.S. dollars. Although the EBCCD sensor has high sensitivity and performance characteristics, such high sensitivity leads to damage from overexposure to light, which causes a shortened lifetime. The damage may occur at the focal plane array or other elements of the EBCCD. Still other problems include pixel saturation, pixel array blooming, and the like during operation. These and other limitations are described throughout the present specification and more particularly below.

Hence it is desirable to improve the EBCCD sensor.

BRIEF SUMMARY OF THE INVENTION

The present invention relates generally to the field of sensors. More particularly, the invention provides a method and system for automatic gain control of sensors. Merely by way of example, the system has been applied to the Electron Bombarded Charge Coupled Device ("EBCCD"). It would be recognized that the invention can be applied to other sensors that need automatic control, including sensors which can be biased to control the sensor gain. Depending upon the embodiment, the present invention achieves improvements associated with conventional limitations of overexposure, pixel saturation, pixel array blooming, and focal plane damage, which can lead to a shortened service life.

In a specific embodiment, a method for controlling gain of a sensor is disclosed. The sensor has a biasable photo emitter, gain control, and a plurality of pixels for reading out photocounts per pixel within a predetermined time. The method includes operating a sensor configured to receive a first number of photons and generate a second number of signal electrons according to a sensor gain. The sensor includes an optic-electro system and an electro-electro system. The optic-electro system is biased by a control bias and configured to emit a third number of photoelectrons in response to the first number of photons according to a quantum efficiency. The third number of photoelectrons is accelerated by an acceleration bias. The electro-electro system has at least one pixel and configured to receive the third number of photoelectrons and generate the second number of signal electrons. Additionally, the method includes measuring at least one number of signal electrons corresponding to the at least one pixel, processing the measured at least one number of signal electrons and determining a measured peak number of signal electrons based on the processed measured at least one number of signal electrons. Moreover, the method includes associating the measured peak number of signal electrons with a desired range for peak number of signal electrons, and if the measured peak number of signal electrons is outside the desired range for peak number of signal electrons, retrieving a voltage value for a sensor bias from a memory system. The voltage value corresponds to a targeted peak number of signal electrons. Also, the method includes adjusting the sensor bias to the retrieved voltage value.

In another specific embodiment, a method for reducing gain of a sensor is disclosed. The sensor has a biasable photo emitter, gain control, and a plurality of pixels for reading out photocounts per pixel within a predetermined time. The method includes operating a sensor configured to receive a first number of photons and generate a second number of signal electrons according to a sensor gain. The sensor includes an optic-electro system and an electro-electro system. The optic-electro system is biased by a control bias and configured to emit a third number of photoelectrons in response to the first number of photons according to a quantum efficiency. The third number of photoelectrons is accelerated by an acceleration bias. The electro-electro system has at least one pixel and configured to receive the third number of photoelectrons and generate the second number of signal electrons. Additionally, the method includes measuring at least one number of signal electrons corresponding to the at least one pixel, processing the measured at least one number of signal electrons and determining a first measured selected number of signal electrons based on the processed measured at least one number of signal electrons. Moreover, the method includes associating the first measured selected number of signal electrons with a desired number of signal electrons, and if the first measured selected number of signal electrons exceeds the desired number of signal electrons, retrieving a voltage value for a sensor bias from a memory system. Also, the method includes the retrieved voltage value corresponding to a targeted number of signal electrons, and adjusting the sensor bias to the retrieved voltage value. The targeted number of signal electrons equals zero.

In yet another embodiment of the present invention, a method for iteratively reducing gain of a sensor is disclosed. The sensor has a biasable photo emitter, gain control, and a plurality of pixels for reading out photocounts per pixel within a predetermined time. The method includes operating a sensor configured to receive a first number of photons and generate a second number of signal electrons according to a sensor gain. The sensor includes an optic-electro system and an electro-electro system. The optic-electro system is biased by a control bias and configured to emit a third number of photoelectrons in response to the first number of photons according to a quantum efficiency. The third number of photoelectrons is accelerated by an acceleration bias. The electro-electro system has at least one pixel and configured to receive the third number of photoelectrons and generate the second number of signal electrons. Additionally, the method includes measuring at least one number of signal electrons corresponding to the at least one pixel, processing the measured at least one number of signal electrons and determining a measured selected number of signal electrons based on the processed measured at least one number of signal electrons. Moreover, the method includes associating the measured selected number of signal electrons with a desired number of signal electrons, and if the measured selected number of signal electrons exceeds the desired number of signal electrons for a predetermined number of consecutive times, retrieving a first voltage value for a sensor bias from a memory system and adjusting the sensor bias to the first retrieved voltage value. The first retrieved voltage value corresponds to a first targeted number of signal electrons. Also, the method includes if the measured selected number of signal electrons is equal to or smaller than the desired number of signal electrons, or if the measured selected number of signal electrons exceeds the desired number of signal electrons for less than the predetermined number of consecutive times, retrieving a second voltage value for the sensor bias from the memory system and adjusting the sensor bias to the second retrieved voltage value. The second retrieved voltage value corresponds to a second targeted number of signal electrons. The first targeted number of signal electrons equals zero, and the second targeted number of signal electrons is larger than zero.

In yet another specific embodiment, a method for reducing saturation of a sensor is disclosed. The sensor has a biasable photo emitter, gain control, and a plurality of pixels for reading out photocounts per pixel within a predetermined time. The method includes operating a sensor configured to receive a first number of photons and generate a second number of signal electrons according to a sensor gain. The sensor includes an optic-electro system and an electro-electro system. The optic-electro system is biased by a control bias and configured to emit a third number of photoelectrons in response to the first number of photons according to a quantum efficiency. The third number of photoelectrons is accelerated by an acceleration bias. The electro-electro system has at least one pixel and configured to receive the third number of photoelectrons and generate the second number of signal electrons. Moreover, the method includes measuring at least one number of signal electrons corresponding to the at least one pixel, processing the measured at least one number of signal electrons and determining a measured selected number of signal electrons based on the processed measured at least on number of signal electrons. Also, the method includes associating the measured selected number of signal electrons with a desired number of signal electrons. The desired number of signal electrons represents the onset of a non-linear gain region of the sensor. Additionally, the method includes if the measured selected number of signal electrons exceeds the desired number of signal electrons, retrieving a voltage value for a sensor bias from a memory system. The retrieved voltage value corresponds to a targeted number of signal electrons. The method also includes adjusting the sensor bias to the retrieved voltage value.

In yet another embodiment of the present invention, a method for reducing pixel damage of a sensor is disclosed. The sensor has a biasable photo emitter, gain control, and a plurality of pixels for reading out photocounts per pixel within a predetermined time. The method includes operating a sensor configured to receive a first number of photons and generate a second number of signal electrons according to a sensor gain. The sensor includes an optic-electro system and an electro-electro system. The optic-electro system is biased by a control bias and configured to emit a third number of photoelectrons in response to the first number of photons according to a quantum efficiency. The third number of photoelectrons is accelerated by an acceleration bias. The electro-electro system has at least one pixel and configured to receive the third number of photoelectrons and generate the second number of signal electrons. Additionally, the method includes measuring at least one number of signal electrons corresponding to the at least one pixel, processing the measured at least one number of signal electrons and determining a measured selected number of signal electrons based on the processed measured at least one number of signal electrons. Moreover, the method includes associating the measured selected number of signal electrons with a desired number of signal electrons. The desired number of signal electrons represents the onset of a damage region for the electro-electro system. Also, the method includes if the measured selected number of signal electrons exceeds the desired number of signal electrons, retrieving a voltage value for a sensor bias from a memory system. The retrieved voltage value corresponds to a targeted number of signal electrons. Additionally, the method includes adjusting the sensor bias to the retrieved voltage value.

In yet another specific embodiment, a method for reducing photocathode damage of a sensor is disclosed. The sensor has a biasable photo emitter, gain control, and a plurality of pixels for reading out photocounts per pixel within a predetermined time. The method includes operating a sensor configured to receive a first number of photons and generate a second number of signal electrons according to a sensor gain. The sensor includes an optic-electro system and an electro-electro system. The optic-electro system is biased by a control bias and configured to emit a third number of photoelectrons in response to the first number of photons according to a quantum efficiency. The third number of photoelectrons is accelerated by an acceleration bias. The electro-electro system has at least one pixel and configured to receive the third number of photoelectrons and generate the second number of signal electrons. Moreover, the method includes measuring at least one number of signal electrons corresponding to the at least one pixel, processing the measured at least one number of signal electrons and determining a measured selected number of signal electrons based on the processed measured at least one number of signal electrons. Also, the method includes associating the measured selected number of signal electrons with a desired number of signal electrons. The desired number of signal electrons represents the onset of a damage region for the optic-electro system. Additionally, the method includes if the measured selected number of signal electrons exceeds the desired number of signal electrons, retrieving a voltage value for a sensor bias from a memory system. The retrieved voltage value corresponds to a targeted number of signal electrons. The method also includes adjusting the sensor bias to the retrieved voltage value.

In yet another specific embodiment of the present invention, a method for extending lifetime of a sensor is disclosed. The sensor has a biasable photo emitter, gain control, and a plurality of pixels for reading out photocounts per pixel within a predetermined time. The method includes operating a sensor configured to receive a first number of photons and generate a second number of signal electrons according to a sensor gain. The sensor includes an optic-electro system and an electro-electro system. The optic-electro system is biased by a control bias and configured to emit a third number of photoelectrons in response to the first number of photons according to a quantum efficiency. The third number of photoelectrons is accelerated by an acceleration bias. The electro-electro system has at least one pixel and configured to receive the third number of photoelectrons and generate the second number of signal electrons. Additionally, the method includes measuring at least one number of signal electrons corresponding to the at least one pixel, processing the measured at least one number of signal electrons and determining a measured selected number of signal electrons based on the processed measured at least one number of signal electrons. Moreover, the method includes associating the measured selected number of signal electrons with a desired number of signal electrons, and if the measured selected number of signal electrons is equal to or smaller than the desired number of signal electrons for a predetermined number of consecutive times, retrieving a first voltage value for a sensor bias from a memory system and adjusting the sensor bias to the first retrieved voltage value. The first retrieved voltage value corresponds to a first targeted number of signal electrons. Also, the method includes if the measured selected number of signal electrons exceeds the desired number of signal electrons, or if the measured selected number of signal electrons is equal to or smaller than the desired number of signal electrons for less than the predetermined number of consecutive times, retrieving a second voltage value for the sensor bias from the memory system and adjusting the sensor bias to the second retrieved voltage value. The second retrieved voltage value corresponds to a second targeted number of signal electrons. The first targeted number of signal electrons equals zero, and the second targeted number of signal electrons is larger than the desired number of signal electrons.

In yet another specific embodiment, a method of operating an electron bombarded charge coupled device includes receiving one or more photons at a first intensity level, generating a plurality of electron particles based upon an intensity of the one or more photons, and capturing the plurality of electrons using an array of pixel elements. Each of the pixel elements is configured in a pixel spatial orientation to capture a pattern in a pixel domain provided by the plurality of electrons. Additionally, the method includes converting the captured pattern in the pixel domain into a resulting captured pattern. The resulting captured pattern is associated with an spatial image of one or more received photons. Moreover, the method includes processing the resulting captured pattern, determining a measured number of signal electrons based on at least information associated with the resulting captured pattern, and associating the measured number of signal electrons with a desired range for number of signal electrons. Also, the method includes if the measured number of signal electrons is outside the desired range for number of signal electrons, retrieving a voltage value for a sensor bias from a memory system. The voltage value corresponds to a targeted number of signal electrons. Additionally, the method includes adjusting the sensor bias to the retrieved voltage value.

Many benefits may be achieved by way of the present invention over conventional techniques. For example, certain embodiments of the present invention can mitigate or prevent overexposure. Other embodiments can also reduce or even prevent pixel saturation, pixel array blooming, scene-brightness induced damages, or any combination thereof. Additionally, some embodiments of the present invention can mitigate or prevent FPA pixel damages and/or photocathode damage. Also, certain embodiments of the present invention can extend EBCCD lifetime. Depending upon the embodiment under consideration, one or more of these benefits may be achieved. These and other benefits as applied to embodiments of the present invention are provided throughout the present specification and more particularly below.

These benefits and various additional objects, features and advantages of the present invention can be fully appreciated with reference to the detailed description and accompanying drawings that follow.

BRIEF DESCRIPTION OF THE DRAWINGS

FIG. 3 (lower) is an expanded schematic of the device, its bias voltages, incoming photons, and resultant electrons which are accelerated to the FPA.

DETAILED DESCRIPTION OF THE INVENTION

The present invention relates generally to the field of sensors. More particularly, the invention provides a method and system for automatic gain control of sensor. Merely by way of example, the system has been applied to the Electron Bombarded Charge Coupled Device ("EBCCD"). It would be recognized that the invention can be applied to other sensors that need automatic control, including sensors which can be biased to control the sensor gain.

Operation of EBCCD Sensor

The EBCCD sensor can provide high-gain and low-noise detection and high-rate data readout, and it can block out and gate open incoming photons to obtain sub-microsecond exposure. But the EBCCD sensor is expensive to make. For example, an EBCCD sensor may cost about $10,000 or possibly more. Additionally, the EBCCD sensor usually has high detection sensitivity and can produce a large number of signal electrons in response to incoming photons. Consequently, the EBCCD sensor can be easily damaged and have only limited service lifetime unless otherwise protected. These and other limitations are described throughout the present specification and more particularly below in reference to the Figures.

Figure 1:
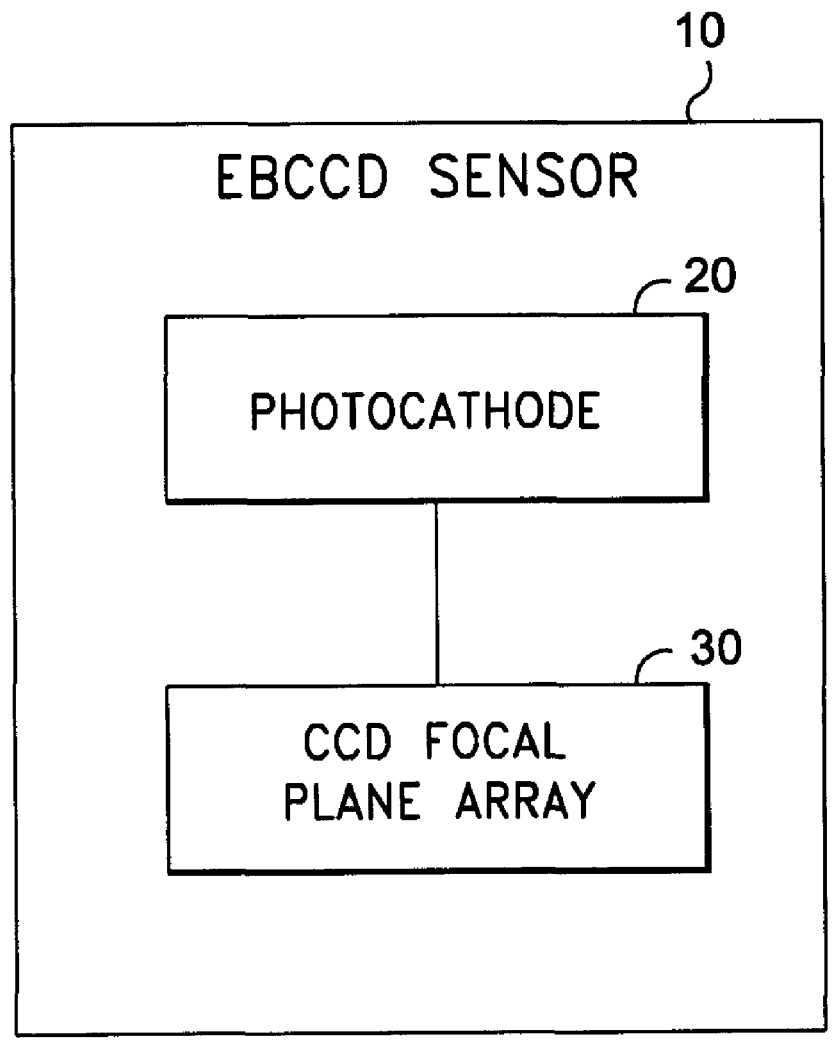
FIG. 1 is a simplified diagram for the EBCCD sensor.
Figure 3:
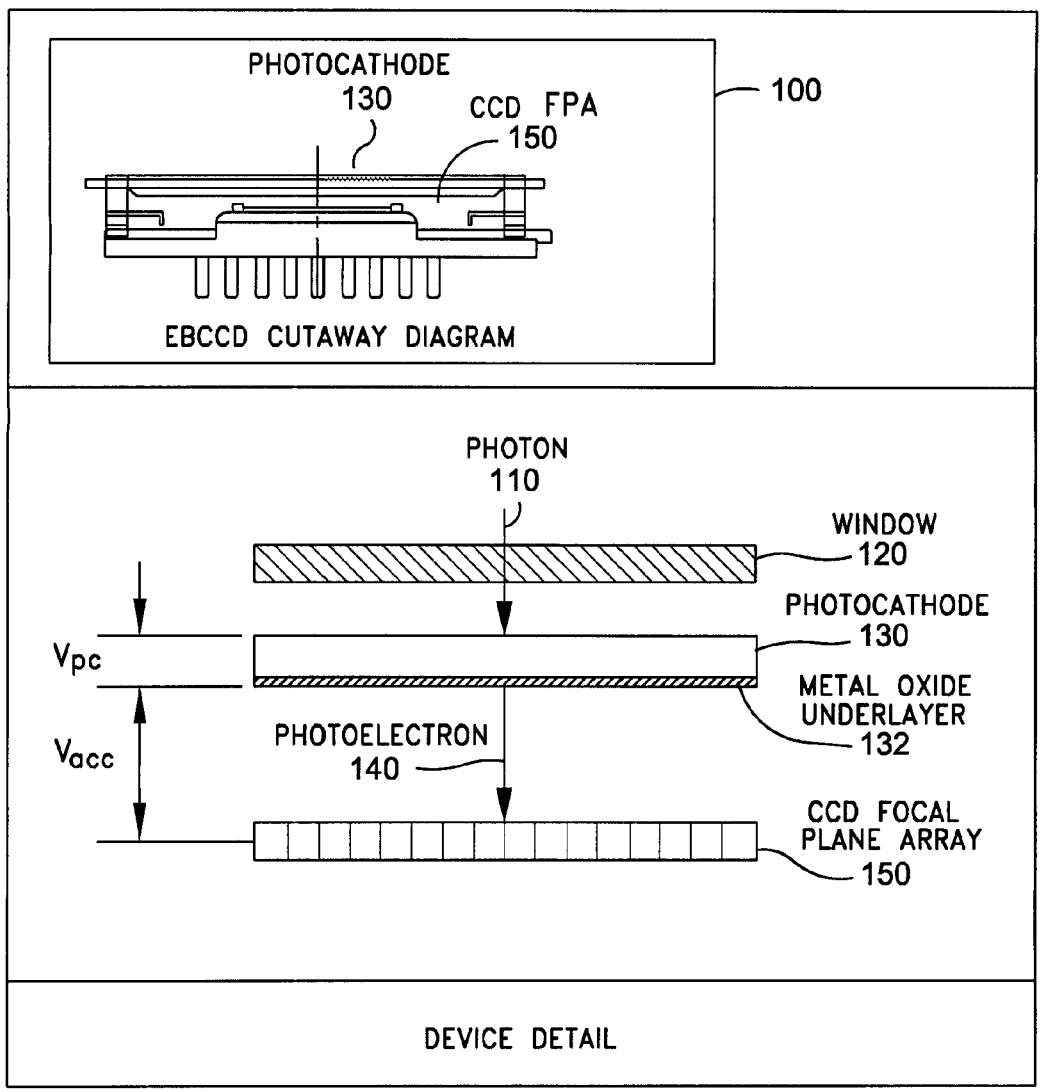
FIG. 3 (upper) is a cutaway diagram of the EBCCD sensor.

FIG. 3 is a simplified diagram for operation of EBCCD sensor. This diagram is merely an illustration, which should not unduly limit the scope of the claims. Photon 110, of wavelength λ and energy $E_p=h\nu$, enters sensor 100 through window 120 and enters photocathode 130 ("PC"). For example, window 120 is made of glass and substantially transparent at wavelength λ, and photocathode 130 is a Schottky-barrier photocathode ("SBPC"), such as one made of InGaAs. Photocathode 130 is a type of optic-electro system. An optic-electro system receives an optical signal and outputs an electrical signal. For example, the optic-electro system is a photoelectron emitter. In photocathode 130, photon 110 creates photoelectron 140. Photocathode is controlled by photocathode bias $V_{pc}$. $V_{pc}$ is a control bias. $V_{pc}$ can lower the conduction band of photocathode 130 by energy $E_{pc}$ equal to $eV_{pc}$, where e is the electron charge. If the magnitude of $V_{pc}$ exceeds a cutoff voltage, photoelectron 140 can escape the emitter of photocathode 130. In contrast, if the magnitude of voltage $V_{pc}$ equals or falls short of the cutoff voltage, photoelectron 140 usually cannot escape from photocathode 130 and are quickly returned to the non-conducting energy band of photocathode 130. Additionally, as shown in FIG. 1, at the bottom surface of photocathode 130, there exists metal oxide underlayer 132. For example, metal oxide underlayer 132 is made of CsO. Below metal oxide underlayer 132, CCD focal plane array ("FPA") 150 is placed to receive escaped photoelectron 140. Focal plane array 150 is usually made of silicon. Between metal oxide underlayer 132 and focal plane array 150 there is a gap 134. For example, gap 134 is under the vacuum condition. In gap 134, photoelectron 140 is accelerated by acceleration bias $V_{acc}$ towards FPA 150. FPA 150 is one type of electro-electro system. An electro-electro system receives an electrical signal and outputs another electrical signal. After entering FPA 150, photoelectron 140 loses its energy in producing a number of electron-hole pairs. Many of the mobile electrons can be collected as signal electrons without being recaptured by ions. For example, at $V_{acc}$ of 2 kV, 150-250 signal electrons can be collected for each photoelectron 140 with appropriate collection mechanism.

Figure 3A:
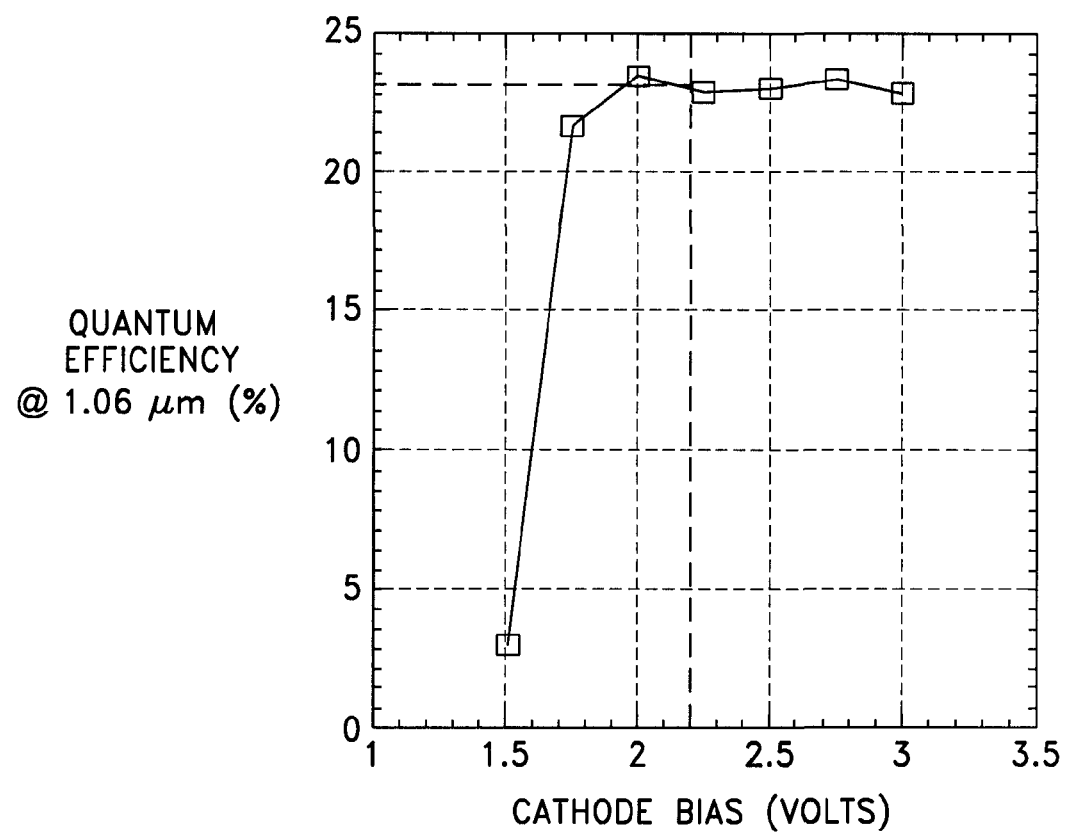
FIG. 3A shows the variation of quantum efficiency with adjustment of the photocathode bias.

FIG. 3A is a simplified diagram of quantum efficiency for a photocathode. This diagram is merely an illustration, which should not unduly limit the scope of the claims. As shown in FIG. 3, the quantum efficiency of photocathode varies with voltage $V_{pc}$. When photocathode 130 is biased at about 1.8 volts or above, photocathode 130 has a quantum efficiency ("QE") of about 0.25 for 1.06-μm photons. More specifically, when $V_{pc}$ equals about 2.2 V, QE equals about 0.23. Hence one photon 110 of about 1-eV energy on the average produces only 0.23 photoelectron 140. If voltage $V_{acc}$ equals 2 kV, every photoelectron 140 creates about 150 signal electrons in FPA 150. In other words, at $V_{acc}$ of 2 kV, FPA 150 has an electron gain ("$G_e$") of about 150. Hence the overall "photon gain" for EBCCD sensor 100 in this case is about 34.5. The "photo gain" is also called the tube gain ("$G_T$"), where $$G_T = QE \times G_e \quad \text{(Equation 1)}$$

Consequently, in this example, one 1.064-μm photon produces about 34.5 signal electrons. Moreover, as shown in FIG. 3, if photocathode 130 is biased at a voltage lower than or equal to about 1.4 volts, almost no photoelectrons are produced and thus none are accelerated across the gap even though $V_{acc}$ may still be applied. Therefore $G_T$ of EBCCD sensor depends not only on $V_{acc}$ but also $V_{pc}$.

As discussed above, the EBCCD sensor may have $G_T$ equal to about 34.5. The shot noise associated with photon counting usually equals to square root of signal counts. Hence in this example, for a single incoming photon, the shot noise equals about 5.9. In addition, the readout noise per pixel equals about 1 equivalent signal electron. Thus the total noise equals the sum of shot noise and readout noise. In this example, the total noise equals about 6.9.

For each incoming photon, the signal-to-noise ratio ("SNR") is defined as follows:

$$SNR = \frac{G_T}{TotalNoise} \quad \text{(Equation 2)}$$

According to Equation 2, SNR in this example equals about 5. This SNR value shows that the EBCCD sensor can count single near-IR photons and read them out with 5 to 10-kHz rate. Similar results can also be obtained for other wavelengths such as from about 0.9 μm to 1.4 μm. EBCCDs with other photocathode types will cover other wavelength regions.

As shown in FIGS. 3 and 3A, the voltages on SBPC 130 and gap 134 provides flexible control over $G_T$ of the EBCCD device. For example, if $V_{pc}$ is progressively made less positive, QE of SBPC 130, i.e., the yield of photoelectrons per input photon, is gradually reduced to zero. Consequently, $G_T$ would be reduced to zero according to Equation 1. Alternatively, $G_T$ may also be controlled by varying voltage $V_{acc}$ which varies $G_e$. And of course, both $V_{pc}$ and $V_{acc}$ may be varied together to control $G_T$.

Figure 2:
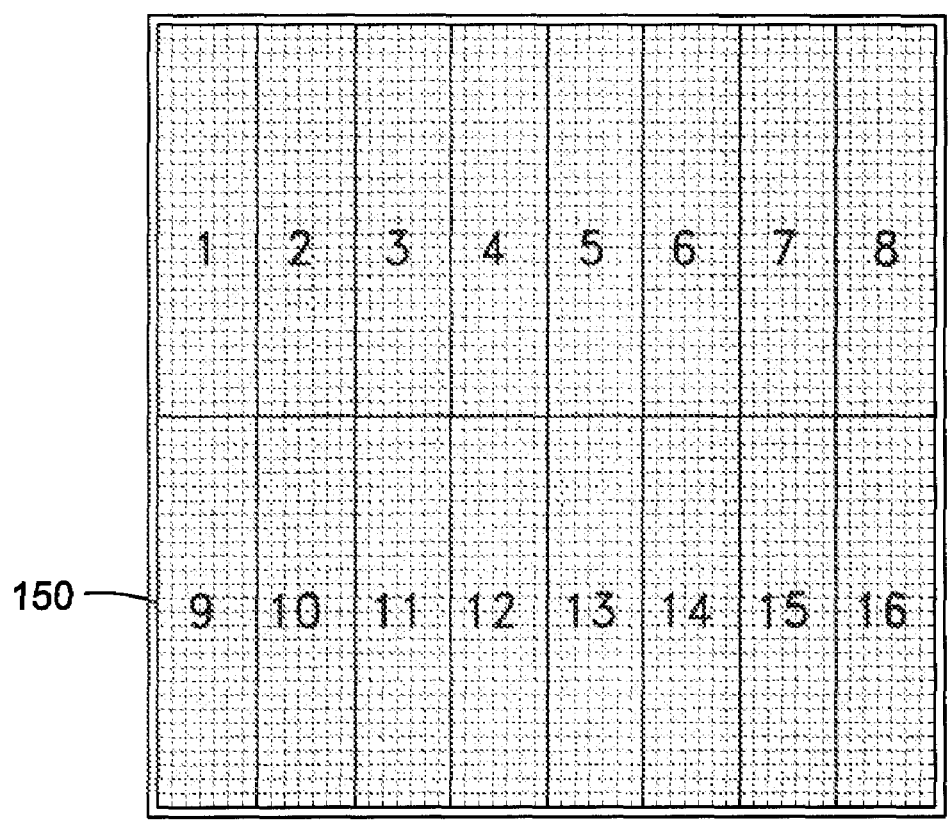
FIG. 2 is a simplified diagram for the conventional focal plane array of EBCCD sensor.

As shown in FIG. 2, FPA 150 includes an array of pixels. For this array of pixels, the number of collected signal electrons at each pixel during a certain time period forms an array of photo-counts. This photo-count information may be processed in various ways. For example, during each data period, the running time-averaged background array $N_{background}$ is subtracted from the raw photo-count array for this time step, and all resulting negative values are set to zero. The resultant signal array $N_{signal}(t)$ as a function of time may be analyzed to find various array parameters, such as the peak pixel signal count $N_{peak}(t)$ for the corresponding time step, the average pixel signal count $N_{average}(t)$ for all or a selected set of pixels. Additionally, other sophisticated processes may be carried out such as obtaining a histogram of number of pixels in certain ranges of pixel signal counts and other analyses including those that would characterize the image contrast.

Figure 4:
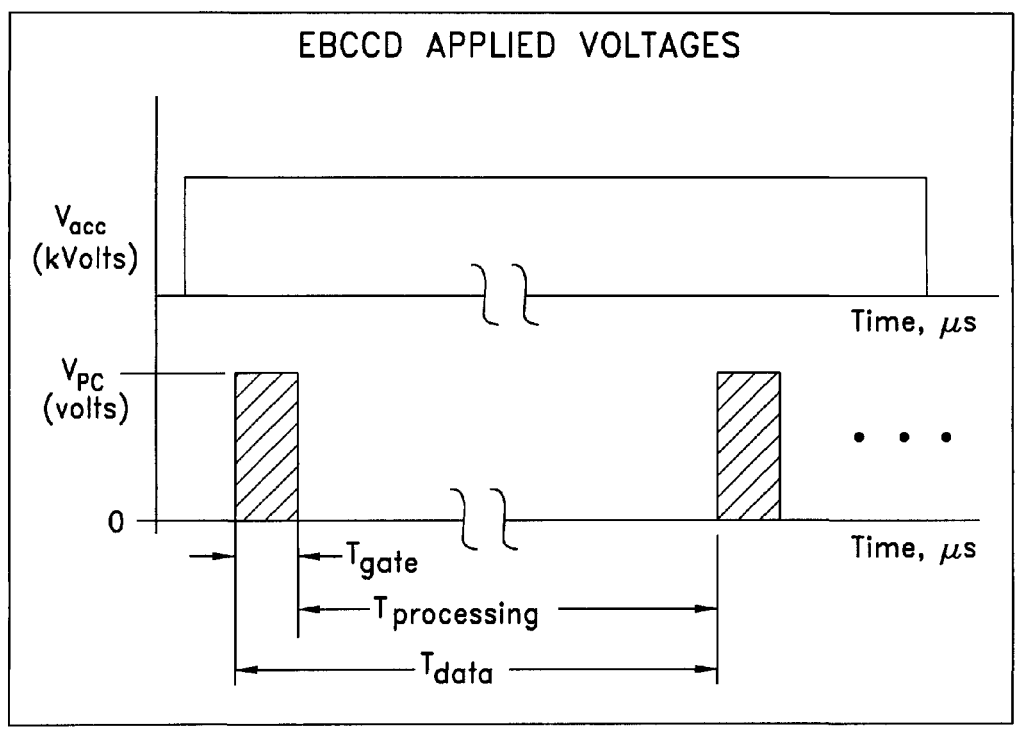
FIG. 4 is a simplified diagram for $V_{pc}$ and $V_{acc}$ as functions of time.

FIG. 4 is a simplified diagram for $V_{pc}$ and $V_{acc}$ as functions of time. This diagram is merely an illustration which should not unduly limit the scope of the claims. For example, the 2-kV $V_{acc}$ is turned on first, then a series of short "gate" pulses are provided to $V_{pc}$ at a rate of $f_{data}$. In this example, $f_{data}$ equals about 5 kHz. The time $T_{data}$ between pulses equals $1/f_{data}$, and in this example is about 200 □s. $T_{data}$ is the sum of the gate pulse width $T_{gate}$ and the date process time $T_{processing}$. For example, $T_{gate}$ equals about 1 μs, and $T_{processing}$ equals about 199 μs. During $T_{gate}$ the EBCCD sensor usually has a non-zero gain; while during $T_{processing}$ the EBCCD sensor usually has a zero gain. If $T_{processing}$ equals about 199 μs, about 50 μs may be consumed by reading out photo-counts from each pixel. This leaves about 149 μs for pixel thresholding by background subtractions, then analysis, and subsequently sending digital commands to control devices such as digital power supplies.

Figure 4A:
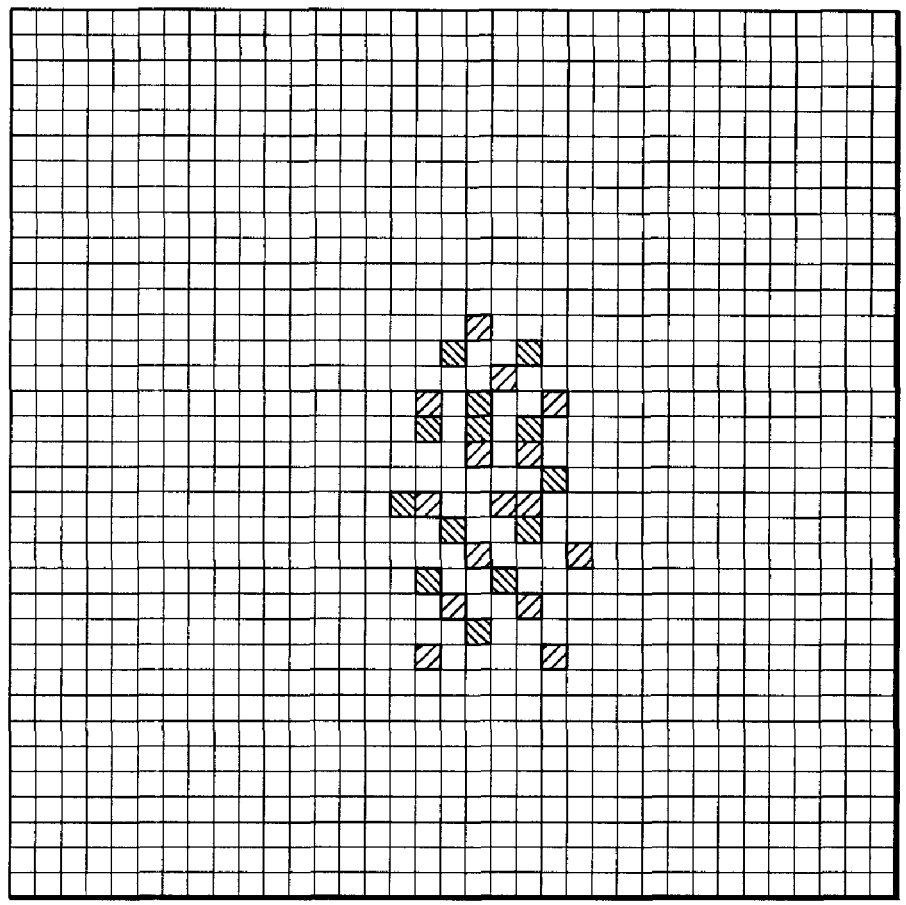
FIG. 4A is a simplified diagram for pixel photo-count array.

FIG. 4A is a simplified diagram for pixel photo-count array. This diagram is merely an illustration, which should not unduly limit the scope of the claims. The electrons generated in the focal plane array have an electron distribution whose charge per unit area is proportional to the image photon distribution that arrived at the photocathode. To recover this electron signal spatial distribution, the area is divided into an array of pixels, e.g., the squares formed by vertical and horizontal rows. For example, an array may include 128 rows and 128 columns, and thus have of 128×128 pixels in total. Here a pixel is referenced by R(i)C(j) where the "i" stands for its row index ranging from 1 to 256 and "j" for its column index. For example, both "i" and "j" range from 1 to 256 respectively. In operation of EBCCD sensor, the pixel charges in each pixel is swept out and is converted to a voltage. The voltage is subsequently transformed by an analog-to-digital converter into a pixel photo-count. The pixel photo-count represents the signal electron count within each pixel.

Performance Issues of EBCCD Sensor

The remarkable sensitivity and responsivity of the EBCCD sensor to photons comes with a price. The EBCCD sensor can easily and rapidly be damaged by overexposure to light and its lifetime prematurely ended. Various faulty operation and damage modes have been observed for the EBCCD sensor. For example, these modes include overexposure, pixel saturation, pixel array blooming, service life limiting, focal plane damage, photocathode ion damage, scene-brightness induced damage, and other modes. The above list is merely an illustration, which should not unduly limit the scope of the claims.

More specifically, overexposure occurs whenever a criterion is not met. For example, the average pixel signal count exceeds a desired value. Pixel saturation occurs when any pixel count approaches the pixel well depth and the gain for this pixel becomes a non-linear function of $V_{acc}$ or $V_{pc}$. For example, the pixel well depth may equal to 1,000 photoelectrons per pixel. Pixel array blooming occurs when pixel counts start reaching their well depths and their excessive photoelectrons spill over into adjacent cells. This overfilled spreading effect is called "blooming" or "whiteout." Service life limiting at least in part relates to the half-lifetime of photocathode for charge emission. The remaining lifetime of the photocathode is determined by the cumulative charge that the photocathode has already produced. For example, for current EBCCDs the half-lifetime provides about 100 hours of normal use of photocathode with good quantum efficiency. Thus it is advantageous to avoid allowing the sensor to produce charge when an actual image scene is not present. When the imaging target of EBCCD sensor does not send a substantial number of photons to the sensor, applying on-state $V_{pc}$ and $V_{acc}$ usually produces only leakage and background electron counts and thereby leads to premature loss of useful lifetime for the EBCCD sensor. For this reason it is desirable to automatically turn off $V_{pc}$ or $V_{acc}$ or both during such periods. Additionally, reduction of lifetime may occur if the incoming photons have too high an high intensity. These photons could result in excessive photoconversion in the photocathode leading to lowered lifetime.

Focal plane damage occurs when excessive localized charge deposition permanently damages the FPA pixels. This can happen whenever an overexposure produces more than desired photocathode emission for the $V_{acc}$ in use. In contrast, photocathode ion damage occurs when the forward bias of $V_{acc}$ for electrons provides a backward acceleration for ions sputtered from the FPA surface by excessive incoming hot electrons. Upon acceleration, these ion gain an energy of $qV_{acc}$, where q is the ion charge, and arrive back at the photocathode. Consequently, these ions can sputter off the conducting metal oxide underlayer of photocathode and reduce the lifetime of the underlayer which must be present for the device to function.

Any of the above faulty operation and damage modes can also arise from variability of scene brightness. One commonly expected performance degrader and damage producer stems from the real operational scenarios for a EBCCD sensor in an advanced adaptive optics system. For example, one imaging target of the EBCCD sensor may be flying at 100 km away while the next imaging target may fly at 500 km away. Since the image brightness usually falls with the square of the distance, the EBCCD sensor needs to deal with a brightness variation of 25, equal to square of 500 divided by 100. If the EBCCD sensor were manually set to have the same gain setting for both targets, severe performance degradation usually results. Automatic gain setting could avoid this. In another example, if the collection telescope is rotated over, thereby allowing the near viewing of the limb of the bright Sun or Moon, severe damage would result with the fixed gain settings for EBCCD. Again, automatic gain reduction would avoid this.

As discussed above and further emphasized here, other faulty operation and damage modes may exist. For example, the EBCCD camera may be destroyed if the testing personnel misreads the meter indicating the intensity of light to be sent to the wavefront sensor device containing the EBCCD camera. As another example, the EBCCD camera may be destroyed if room lights are mistakenly turned on when the testing should be performed in a darkened laboratory. In all cases, rapid gain control could avoid serious sensor damage.

Calibration of EBCCD Sensor

Figure 5:
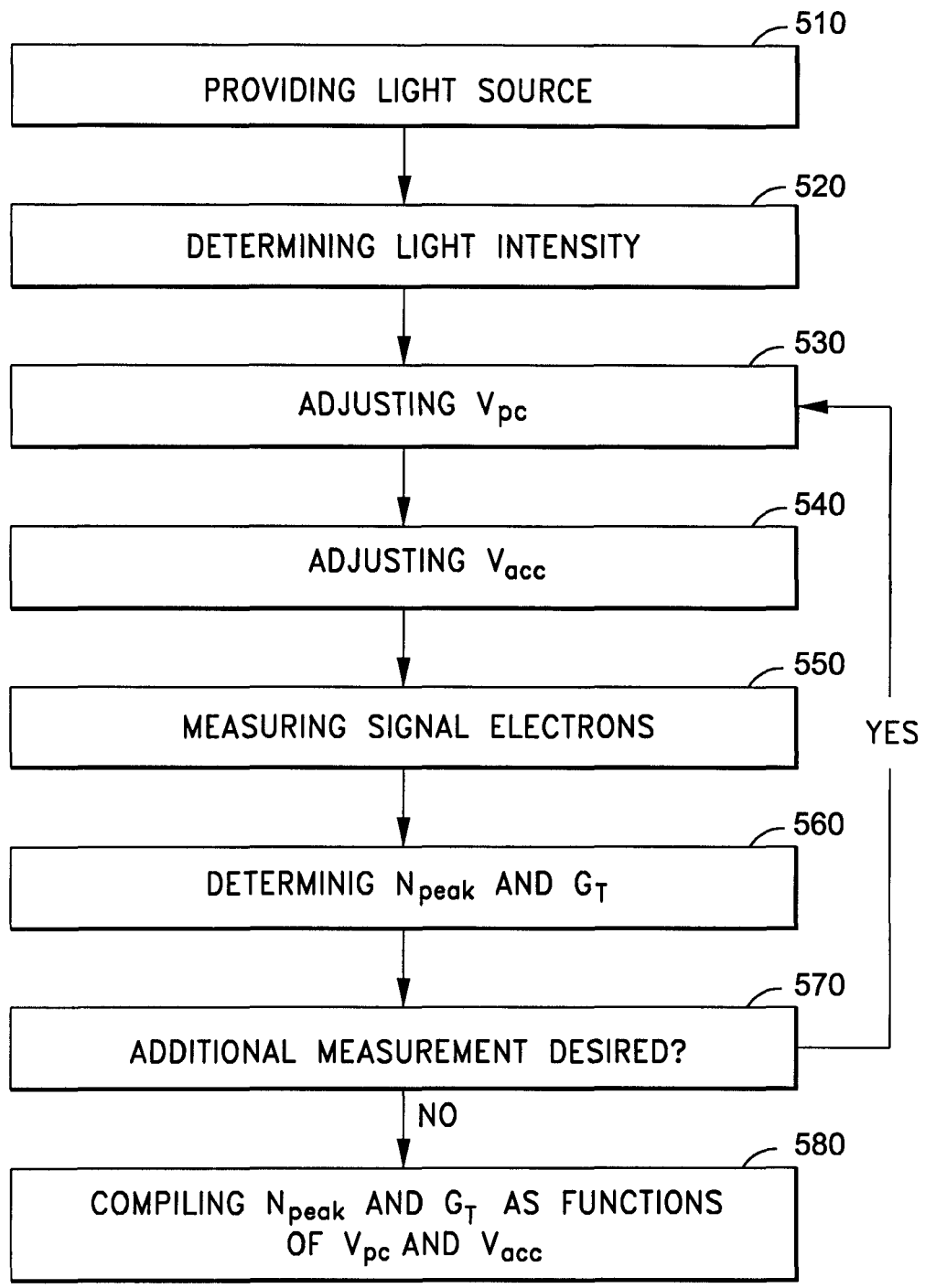
FIG. 5 is a simplified block diagram for calibrating EBCCD sensor according to one embodiment of the present invention.

FIG. 5 is a simplified block diagram for calibrating an EBCCD sensor according to one embodiment of the present invention. This diagram is merely an example, which should not unduly limit the scope of the claims. One of ordinary skill in the art would recognize many variations, alternatives, and modifications. The method of calibrating EBCCD sensor includes process 510 for providing light source, process 520 for determining light intensity, process 530 for adjusting $V_{pc}$, process 540 for adjusting $V_{acc}$, process 550 for measuring signal electrons, process 560 for determining $N_{peak}$ and $G_T$, process 570 for determining desirability of additional measurement, process 580 for compiling $N_{peak}$ and $G_T$ as functions of $V_{pc}$ and $V_{acc}$. Although the above has been shown using a selected sequence of processes, there can be many alternatives, modifications, and variations. For example, some of the processes may be expanded and/or combined. Process 510 for providing light source and process for determining light intensity may be combined. Process 530 for adjusting $V_{pc}$ and process 540 for adjusting $V_{acc}$ can be combined. Other processes may be inserted to those noted above. A process of interpolating $G_T$ as a function of $V_{pc}$ and $V_{acc}$ can be inserted between process 570 and process 580, or inserted after process 580. Depending upon the embodiment, the specific sequence of steps may be interchanged with others replaced. Process 580 of compiling $N_{peak}$ and $G_T$ as functions of $V_{pc}$ and $V_{acc}$ may be performed prior to process 570 for determining desirability of additional measurement. Process 530 for adjusting $V_{pc}$ may be skipped if $V_{pc}$ has been set to a desirable value. Similarly process 540 for adjusting $V_{acc}$ may be skipped if $V_{acc}$ has been set to a desirable value. Both processes 530 and 540 may be skipped if a measurement is to be repeated at the same $V_{pc}$ and $V_{acc}$. Further details of these elements are found throughout the present specification and more particularly below.

At process 510 for providing light source, a light source is provided to send photons into an EBCCD camera. For example, the light source is a laser light source. At process 520 for determining light intensity, the light intensity of the light source may be calibrated. If the light has a frequency v, the intensity of photon flux can be determined according to $E_p = hv$, where $E_p$ is the photon energy and h is the Plank's constant. At process 530 for adjusting $V_{pc}$, $V_{pc}$ is adjusted to a desired voltage value. Similarly, at process 540 for adjusting $V_{acc}$, $V_{acc}$ is adjusted to a desired voltage value. As discussed above, process 530 or process 540 may be skipped, so that only one of $V_{pc}$ or $V_{acc}$ is adjusted for each measurement. At process 550 for measuring signal electrons, signal electrons generated within the FPA pixels are collected, and raw photo-count array is thereby obtained. At process 560 for determining $N_{peak}$ and $G_T$, the raw photo-count array is subtracted by the running time-averaged background array $N_{background}$, and all resulting negative values are set to zero. After subtraction, the peak value for resulting pixel photo-count is identified and labeled as peak pixel signal count $N_{peak}$. The number of peak signal count is divided by number of incoming photons, and their ratio is the gain $G_T$ of the EBCCD sensor. At process 570 for determining desirability of additional measurement, it is determined whether additional measurement for different $V_{pc}$ or/and $V_{acc}$ or repeated measurement for the same $V_{pc}$ and $V_{acc}$ should be performed. At process 580 for compiling $N_{peak}$ and $G_T$ as functions of $V_{pc}$ and $V_{acc}$, $N_{peak}$ and $G_T$ are compiled as functions of $V_{pc}$ and $V_{acc}$ respectively. Even though $G_T$ usually depends on both $V_{pc}$ and $V_{acc}$, the compiled data may reflect how $G_T$ changes with $V_{pc}$ alone, with $V_{acc}$ alone, or both $V_{pc}$ and $V_{acc}$. Other methods of compiling $G_T$ can also be used, such as averaging $G_T$ for a selected set of pixels.

Figure 5A:
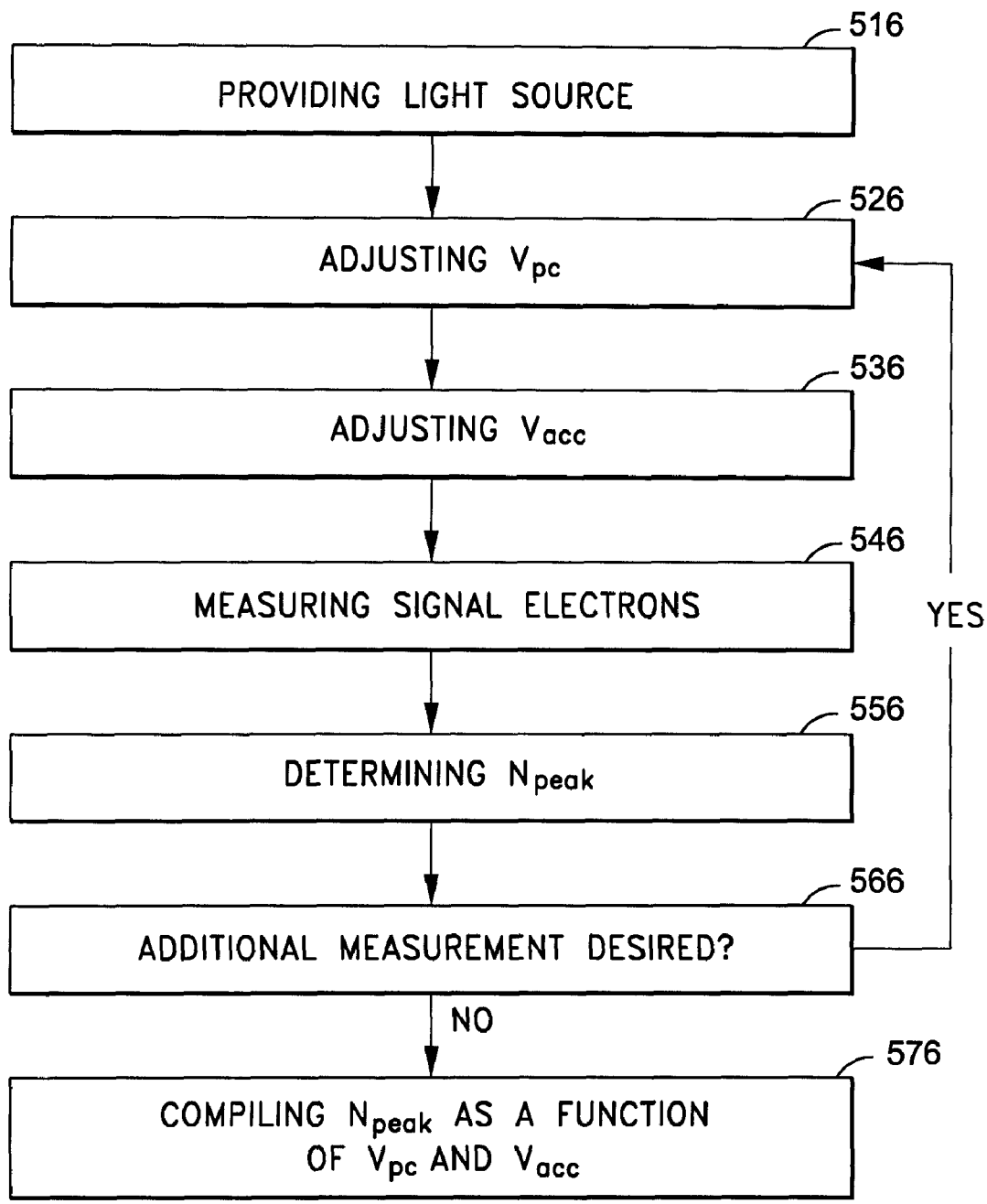
FIG. 5A is a simplified block diagram for calibrating EBCCD sensor according to another embodiment of the present invention.

FIG. 5A is a simplified block diagram for calibrating EBCCD sensor according to another embodiment of the present invention in which the absolute sensor gain is not needed, but only the relation between the peak array count versus bias voltage. This diagram is merely an example, which should not unduly limit the scope of the claims. One of ordinary skill in the art would recognize many variations, alternatives, and modifications. The method of calibrating EBCCD sensor includes process 516 for providing light source, process 526 for adjusting $V_{pc}$, process 536 for adjusting $V_{acc}$, process 546 for measuring signal electrons, process 556 for determining $N_{peak}$, process 566 for determining desirability of additional measurement, process 576 for compiling $N_{peak}$ as a function of $V_{pc}$ and $V_{acc}$. Although the above has been shown using a selected sequence of processes, there can be many alternatives, modifications, and variations. For example, some of the processes may be expanded and/or combined. Process 530 for adjusting $V_{pc}$ and process 540 for adjusting $V_{acc}$ can be combined. Other processes may be inserted to those noted above. A process of interpolating $N_{peak}$ as a function of $V_{pc}$ and $V_{acc}$ can be inserted between process 566 and process 576, or inserted after process 576. Depending upon the embodiment, the specific sequence of steps may be interchanged with others replaced. Process 576 of compiling $N_{peak}$ as a function of $V_{pc}$ and $V_{acc}$ may be performed prior to process 566 for determining desirability of additional measurement. Process 526 for adjusting $V_{pc}$ may be skipped if $V_{pc}$ has been set to a desirable value. Similarly process 536 for adjusting $V_{acc}$ may be skipped if $V_{acc}$ has been set to a desirable value. Both processes 526 and 536 may be skipped if a measurement is to be repeated at the same $V_{pc}$ and $V_{acc}$. Further details of these elements are found throughout the present specification and more particularly below.

More specifically, processes 516, 526, 536, 546, and 566 are substantially similar to processes 510, 530, 540, 550, and 570 respectively as discussed above. At process 556 for determining $N_{peak}$, the raw photo-count array is subtracted by the running time-averaged background array $N_{background}$, and all resulting negative values are set to zero. After subtraction, the peak value for resulting pixel photo-counts is identified and labeled as peak pixel signal count $N_{peak}$. At process 576 for compiling $N_{peak}$ as a function of $V_{pc}$ and $V_{acc}$, $N_{peak}$ is compiled as a function of $V_{pc}$ and $V_{acc}$ respectively. Even though $N_{peak}$ usually depends on both $V_{pc}$ and $V_{acc}$, the compiled data may reflect how $N_{peak}$ changes with $V_{pc}$ alone, with $V_{acc}$ alone, or both $V_{pc}$ and $V_{acc}$. Other methods of compiling $N_{peak}$ can also be used, such as averaging $N_{peak}$ for a selected set of pixels.

Figure 6:
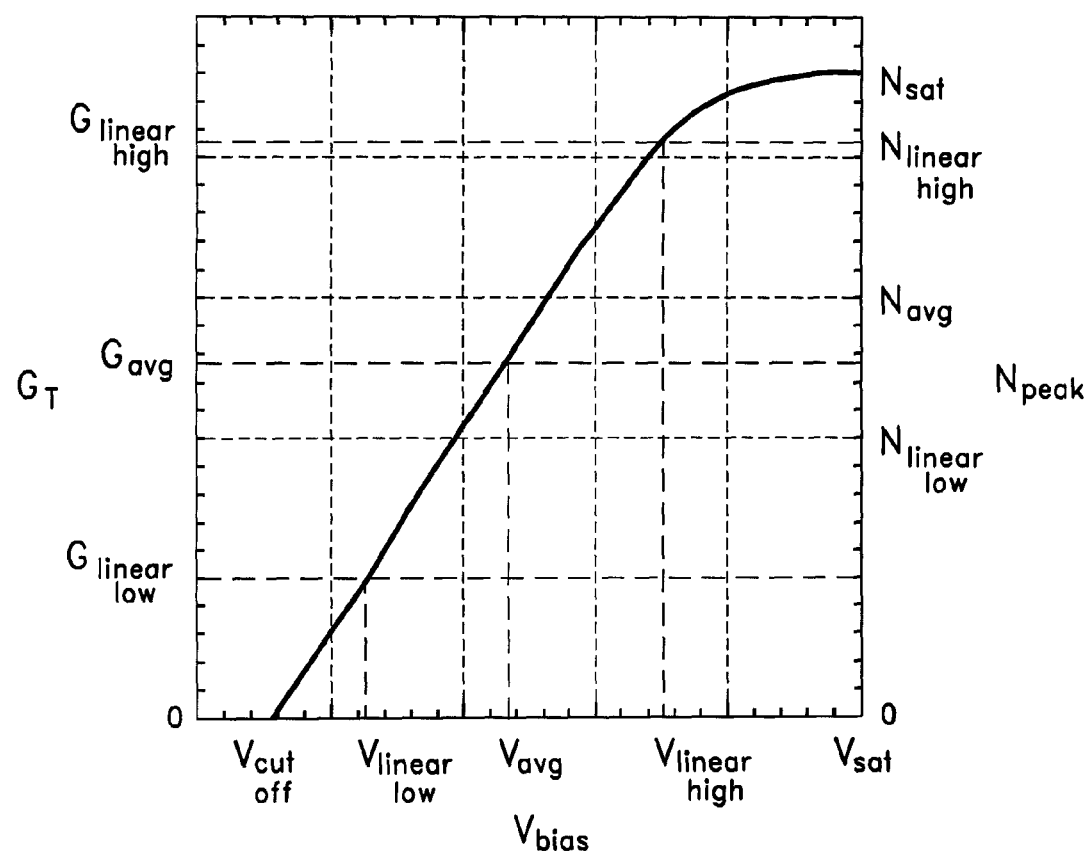
FIG. 6 is a simplified diagram for $G_T$ and $N_{peak}$ changing with $V_{pc}$ or $V_{acc}$.

FIG. 6 is a simplified diagram for $G_T$ and $N_{peak}$ changing with $V_{pc}$ or $V_{acc}$ according to one embodiment of the present invention. The diagram is merely an example, which should not unduly limit the scope of the claims. One of ordinary skill in the art would recognize many variations, alternatives, and modifications. For example, certain calibration processes may obtain both $G_T$ and $N_{peak}$ as functions of $V_{pc}$ or $V_{acc}$. Other calibration processes may obtain both $G_T$ as a function of $V_{pc}$ or $V_{acc}$. Yet other calibration processes may obtain only $N_{peak}$ as a function of $V_{pc}$ or $V_{acc}$. In FIG. 6, the left vertical axis represents $G_T$ of EBCCD sensor, the right vertical axis represents peak pixel signal count $N_{peak}$, and the horizontal axis represents $V_{bias}$. $V_{bias}$ is photocathode bias $V_{pc}$, acceleration bias $V_{acc}$, or any combination thereof. At $V_{bias}$ equal to $V_{cutoff}$, $G_T$ and $N_{peak}$ are seen drop to zero. Hence $V_{cutoff}$ is the onset of the cutoff region of the sensor, where the gain of the sensor is equal to zero when $V_{bias}$ is equal to or smaller than $V_{cutoff}$. At $V_{bias}$ equal to $V_{sat}$, $G_T$ and $N_{peak}$ reach constant or saturation values $G_{sat}$ and $N_{sat}$ respectively. Between $V_{linearlow}$ and $V_{linearhigh}$, $G_T$ and $N_{peak}$ increase linearly with $V_{bias}$. At $V_{bias}$ equal to $V_{linearlow}$, $G_T$ and $N_{peak}$ equal $G_{linearlow}$ and $N_{linearlow}$ respectively. Similarly, at $V_{bias}$ equal to $V_{linearhigh}$, $G_T$ and $N_{peak}$ equal $G_{linearhigh}$ and $N_{linearhigh}$ respectively. The average of $V_{linearlow}$ and $V_{linearhigh}$ equals $V_{avg}$. At $V_{avg}$, $G_T$ and $N_{peak}$ equal $G_{avg}$ and $N_{avg}$ respectively. At discussed above and further emphasized here, FIG. 6 is merely an example. The measured $G_T$, $N_{peak}$, and $V_{bias}$ may be compiled into a database. The database may take various forms, such as written document on paper, electronic file on computer, or combination thereof. The database may take various structure, such as lookup table or fitted curve. For the above example, $G_T$ may be fitted by the following function:

$$G_T = -695.5 + 760.7 \times V_{bias} - 194.9 \times V_{bias}^2 \quad \text{(Equation 3)}$$

Additionally, the tables of measured $G_T$, $N_{peak}$, and $V_{bias}$ may be used to interpolate or extrapolate values of $G_T$ and $N_{peak}$ at any $V_{bias}$ respectively. The interpolation or extrapolation may be performed before, during, or after the compilation. Alternatively, the interpolation or extrapolation may be performed at any time.

Control of EBCCD Sensor

The compiled data for $G_T$, $N_{peak}$ and $V_{bias}$ can be used to control and protect the EBCCD sensor. According to one embodiment of the present invention, at each time step, pixel signal counts are measured across the focal plane array of the EBCCD sensor. Subsequently, the measured pixel signal counts are compared with a preset criterion or criteria. In response, $V_{pc}$, $V_{acc}$, or both are adjusted for remedial action. For example, $V_{pc}$, $V_{acc}$, or both are adjusted automatically, manually, or combination thereof. In another example, $V_{pc}$, $V_{acc}$, or both are provided by a digitally controlled power supply or other type of power supply. For rapid, automatic control, the comparisons between measured and desired values and the response to any differences are all made in the computer in one processing time step.

The control of the EBCCD sensor with compiled data of $G_T$, $N_{peak}$ and $V_{bias}$ includes, for example, automatic gain control, latch-off control, m-trial latch-off control, prevention of saturation, prevention of FPA pixel damage, prevention of photocathode damage, and extension of EBCCD lifetime. These examples are not exhaustive and should not unduly limit the scope of the claims. One of ordinary skill in the art would recognize many variations, alternatives, and modifications. Additionally, these different modes of control may control the EBCCD sensor simultaneously or sequentially. For example, m-trial latch-off control and automatic gain control may control the EBCCD sequentially.

Figure 7:
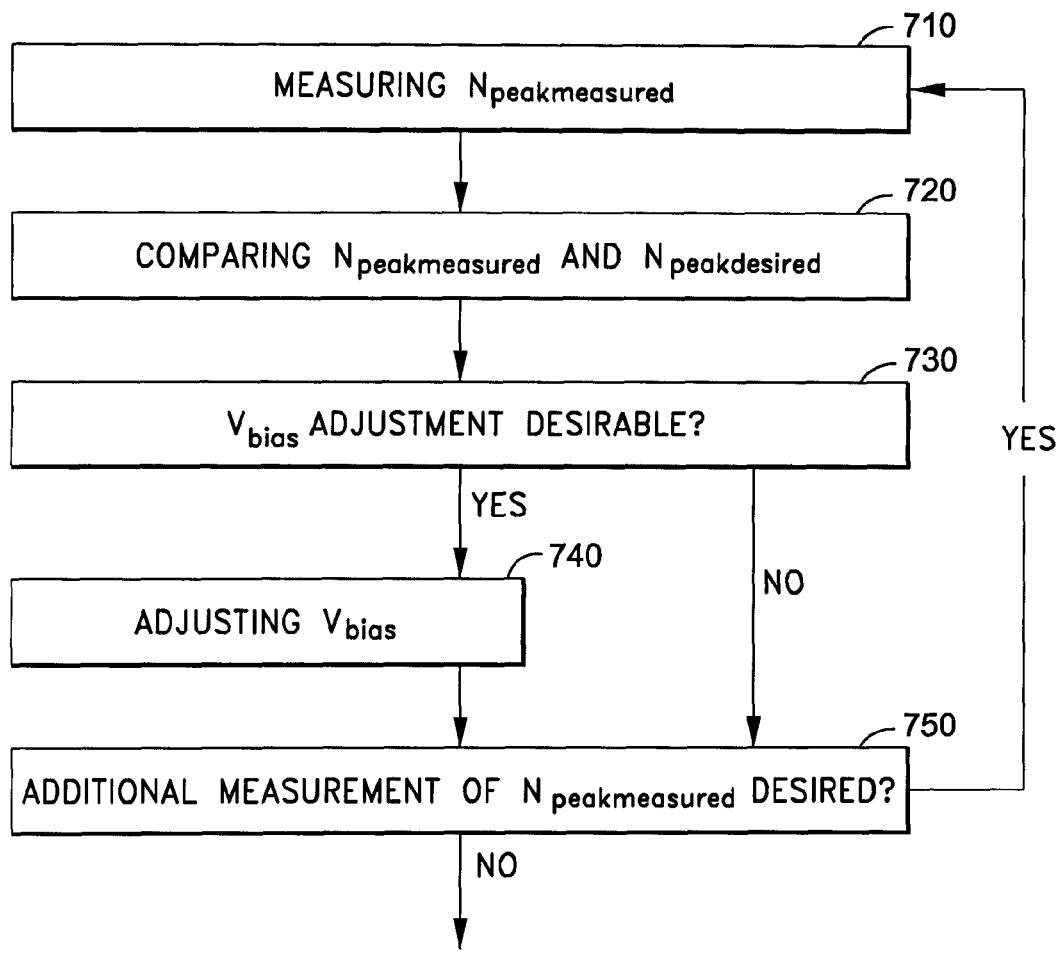
FIG. 7 is a simplified diagram for automatic gain control.

FIG. 7 is a simplified diagram for automatic gain control according to one embodiment of the present invention. This diagram is merely an illustration, which should not unduly limit the scope of the claims. One of ordinary skill in the art would recognize many variations, alternatives, and modifications. The method for automatic gain control includes process 710 for measuring peak pixel signal count $N_{peakmeasured}$, process 720 for comparing peak pixel signal count $N_{peakmeasured}$ and desired peak pixel signal count $N_{peakdesired}$, process 730 for determining desirability of $N_{peakdesired}$, process 740 for adjusting $V_{bias}$, process 750 for determining desirability of additional measurement of $N_{peakmeasured}$. Although the above has been shown using a selected sequence of processes, there can be many alternatives, modifications, and variations. For example, some of the processes may be expanded and/or combined. Process 720 for comparing peak pixel signal count $N_{peakmeasured}$ and desired pixel signal count $N_{peakdesired}$ and process 730 for determining desirability of adjusting $V_{bias}$ may be combined. Other processes may be inserted to those noted above. Another process for determining desirability for additional measurement of $N_{peakmeasured}$ can be performed after process 730. Depending upon the embodiment, the specific sequence of steps may be interchanged with others replaced. Further details of these elements are found throughout the present specification and more particularly below.

At process 710 for measuring $N_{peakmeasured}$, pixel signal counts are read out of FPA. Pixel signal counts are usually converted into digital format. The digital pixel signal counts are processed to eliminate background photo-counts and their maximum value, i.e., $N_{peakmeasured}$ is then determined. At process 720 for comparing $N_{peakmeasured}$ and $N_{peakdesired}$, the measured peak pixel signal count is compared with the desired peak pixel signal count. $N_{peakdesired}$ may be represented by a range of values containing one or more values. For example, the $N_{peakdesired}$ range may fall between or overlap with the range from $N_{linearlow}$ to $N_{linearhigh}$. At process 730 for determining desirability of adjusting $V_{bias}$, $V_{bias}$ should be changed if $N_{peakmeasured}$ falls outside of the $N_{peakdesired}$ range.

At process 740 for adjusting $V_{bias}$, $V_{bias}$ is changed to bring $N_{peakmeasured}$ back to the $N_{peakdesired}$ range. The adjustment may be performed by changing settings of the digitally controlled power supply or by other means. For example, $V_{bias}$ can be adjusted to bring $N_{peakmeasured}$ back to the $N_{peakdesired}$ range during the next $T_{gate}$ interval as shown in FIG. 4. Additionally, process 740 involves adjustment of photocathode bias $V_{pc}$, acceleration bias $V_{acc}$, or both $V_{pc}$ and $V_{acc}$. For example, if $N_{peakmeasured}$ lies below the lower end of the $N_{peakdesired}$ range, $V_{acc}$ may be quickly raised to provide automatic scene brightness control. In bringing $N_{peakmeasured}$ back to the $N_{peakdesired}$ range, many options may be implemented. For example, $N_{peakmeasured}$ may be brought up to the lower end of the $N_{peakdesired}$ range if $N_{peakmeasured}$ falls below the lower end. Similarly, $N_{peakmeasured}$ may be brought down to the upper end of the $N_{peakdesired}$ range if $N_{peakmeasured}$ exceeds the upper end. Alternatively, $N_{peakmeasured}$ may be adjusted to a present value, such as $N_{avg}$, so that the gain is always automatically held to the desired range and the scenes are prevented from over- or under-exposure.

The adjustment may be accomplished through a scaling algorithm as shown below:

$$V_{biasnew} = V_{biasold} \times \frac{N_{peaktargeted}}{N_{peakmeasured}} \qquad \text{(Equation 4)}$$

where $V_{biasold}$ and $V_{biasnew}$ are $V_{bias}$ values before and after the adjustment. $N_{peaktargeted}$ represents the target $N_{peak}$ for process 740, and it falls within the $N_{peakdesired}$ range. In other words, $V_{biasold}$ and $V_{biasnew}$ correspond to $N_{peakmeasured}$ and $N_{peaktargeted}$ respectively. The scaling algorithm usually works well if both $N_{peakmeasured}$ and $N_{peaktargeted}$ falls between $N_{linearlow}$ and $N_{linearhigh}$, and intensity of incoming photons received by the EBCCD sensor does not change substantially over a short period of time.

At process 750 for determining desirability for additional measurement of $N_{peakmeasured}$, it is determined whether automatic gain control is desired in the next time step. The automatic gain control is very important under normal operation of the EBCCD sensor. The EBCCD sensor may view scenes of variable brightness in close proximity of time. For example, one imaging target may be located as close as 10s of kilometers away and the next imaging target may be as far as 100s of kilometers distant. Then the EBCCD sensor would automatically adjust from a low gain for bright scene of a nearby target to a high gain required for the distant, dim target scene. For example, if the sensor is operating at 5 kHz data rate, then this adjustment would be made within the next 200 μs.

Figure 8:
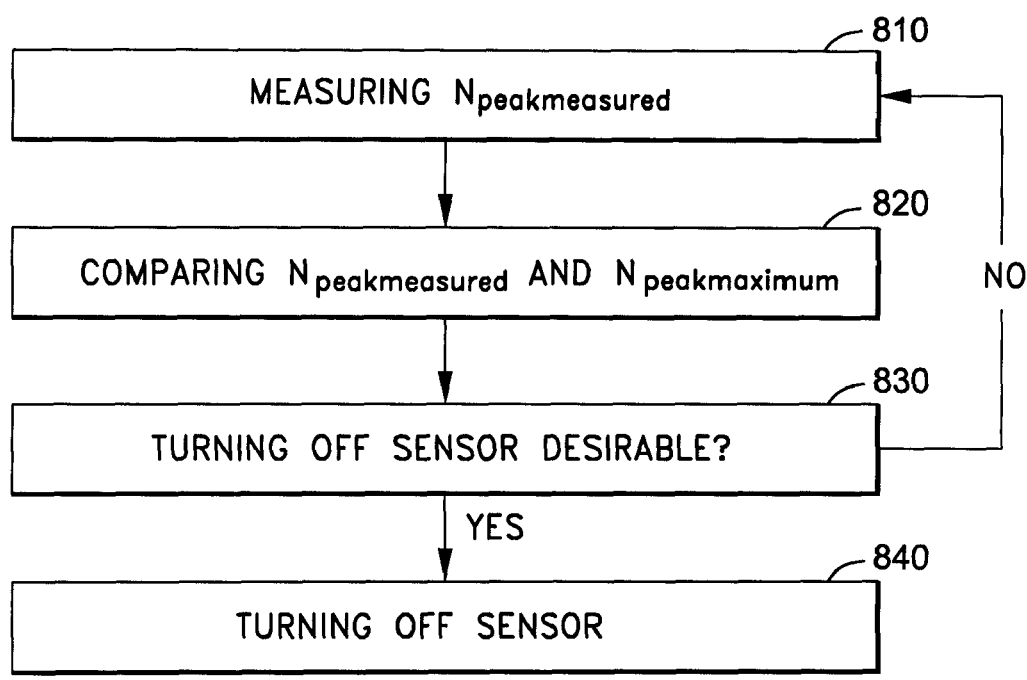
FIG. 8 is a simplified diagram for latch off control.

FIG. 8 is a simplified diagram for latch off control according to another embodiment of the present invention. This diagram is merely an illustration, which should not unduly limit the scope of the claims. One of ordinary skill in the art would recognize many variations, alternatives, and modifications. The method for latch off control includes process 810 for measuring peak pixel signal count $N_{peakmeasured}$, process 820 for comparing peak pixel signal count $N_{peakmeasured}$ and desired maximum peak pixel signal count $N_{peakmaximum}$, process 830 for determining desirability of turning off sensor, and process 840 for turning off sensor. Although the above has been shown using a selected sequence of processes, there can be many alternatives, modifications, and variations. For example, some of the processes may be expanded and/or combined. Process 820 for comparing $N_{peakmeasured}$ and $N_{peakmaximum}$ and process 830 for determining desirability of turning off sensor may be combined. Other processes may be inserted to those noted above. Depending upon the embodiment, the specific sequence of steps may be interchanged with others replaced. Further details of these elements are found throughout the present specification and more particularly below.

At process 810 for measuring peak pixel signal count $N_{peakmeasured}$, the peak pixel signal count is determined in a way substantially similar to that of process 710. At process 820 for comparing measured peak signal count $N_{peakmeasured}$ and desired maximum peak signal count $N_{peakmaximum}$, the measured peak pixel signal count is compared with the desired maximum peak pixel signal count. For example, $N_{peakmaximum}$ may fall between $N_{linearlow}$ and $N_{linearhigh}$, equal $N_{linearhigh}$ or $N_{sat}$, or take other value. At process 830 for determining desirability of turning off the sensor, the EBCCD sensor should be turn off if $N_{peakmeasured}$ exceeds $N_{peakmaximum}$. In the special case of an M-latch mode of operation, this criterion is changed to be: Has Npeakmeasured exceeded Npeakdesired for the last M time steps? If so, then turn off the sensor or at least reduce its bias voltages so there is no sensor gain. If not, cycle back for another time step. At process 840 for turning off sensor, if turning off the sensor has been deemed desirable, the EBCCD sensor is turned off by adjusting $G_T$ to zero. As shown in FIG. 6, $G_T$ becomes zero if $V_{bias}$ is lowered to being equal to or smaller than $V_{cutoff}$. For example, according to Equation 1, $G_T$ becomes zero if QE, $G_e$, or both QE and $G_e$ become zero. Upon the turnoff, the sensor may require manual reset to restart or can utilize an automatic reset to restart when a present criterion or criteria are satisfied. Additionally, if turning off the sensor is not deemed desirable at process 830, process 810 may be repeated to monitor $N_{peakmeasured}$ during $T_{gate}$.

Figure 8A:
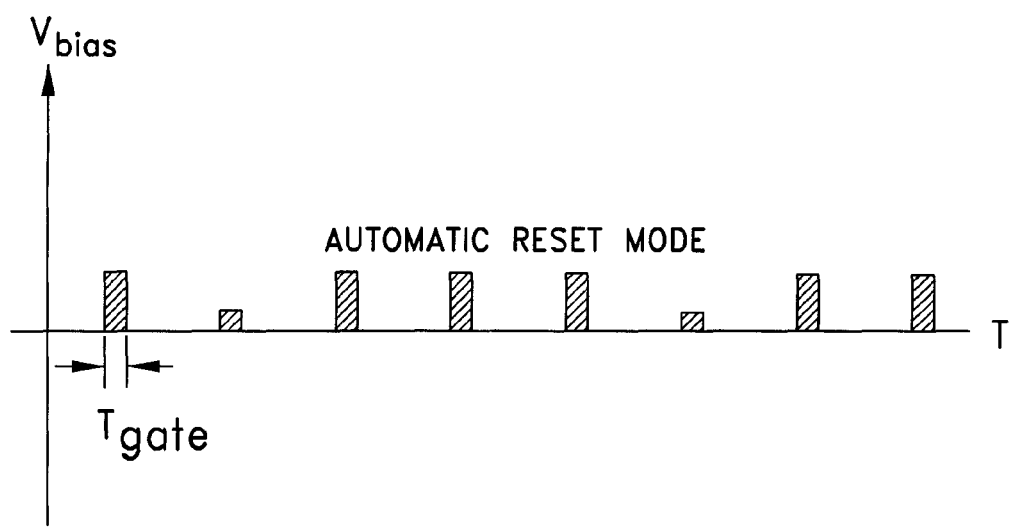
FIG. 8A is a simplified diagram for latch off control with automatic reset.

FIG. 8A is a simplified diagram for latch off control with automatic reset according to one embodiment of the present invention. This diagram is merely an example. which should not unduly limit the scope of the claims. One of ordinary skill in the art would recognize many variations, alternatives, and modifications. As shown in FIG. 8A, the EBCCD sensor is turned off by adjusting $V_{bias}$ to being equal or smaller than $V_{cutoff}$. Subsequently, during the next $T_{gate}$ period, $V_{bias}$ is set to a value that allows a small $G_T$, such as 1/100 of desired $G_T$. If no resulting pixel signal count exceeds $N_{peakmaximum}$, $V_{bias}$ is set to another value during the next $T_{gate}$ period and thereby provide an even higher $G_T$. This incremental process may be repeated until the desired $G_T$ is achieved.

Figure 9:
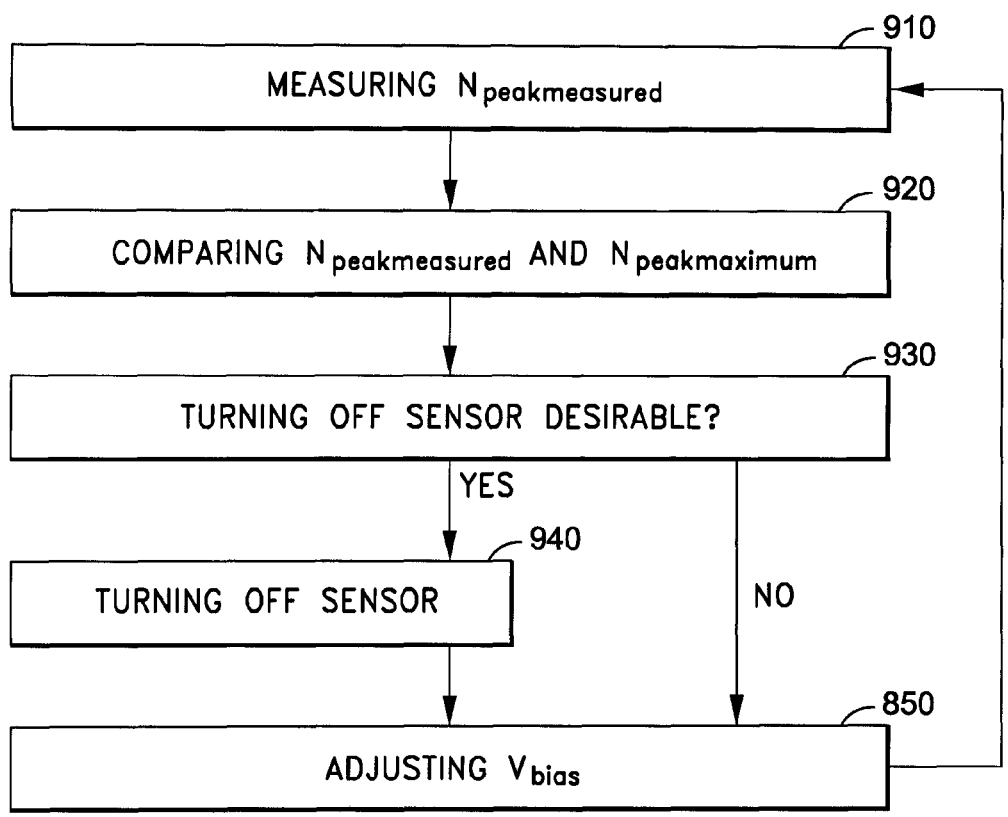
FIG. 9 is a simplified diagram for m-trial latch-off control.

FIG. 9 is a simplified diagram for m-trial latch-off control according to yet another embodiment of the present invention. This diagram is merely an illustration, which should not unduly limit the scope of the claims. One of ordinary skill in the art would recognize many variations, alternatives, and modifications. The method for m-trial latch-off control includes process 910 for measuring peak pixel signal count $N_{peakmeasured}$, process 920 for comparing measured peak pixel signal count $N_{peakmeasured}$ and desired maximum peak pixel signal count $N_{peakmaximum}$, process 930 for determining desirability of turning off the sensor, process 940 for turning off the sensor, and process 950 for adjusting $V_{bias}$. Although the above has been shown using a selected sequence of processes, there can be many alternatives, modifications, and variations. For example, some of the processes may be expanded and/or combined. Process 930 for determining desirability of turning off the sensor and process 940 for turning off the sensor may be combined. Other processes may be inserted to those noted above. Depending upon the embodiment, the specific sequence of steps may be interchanged with others replaced. Further details of these elements are found throughout the present specification and more particularly below.

At process 910 for measuring peak signal count $N_{peakmeasured}$, the peak pixel signal count is determined in a way substantially similar to that of process 710 or process 810. At process 920 for comparing measured peak pixel signal count $N_{peakmeasured}$ and desired maximum peak pixel signal count $N_{peakmaximum}$, the measured peak pixel signal count is compared with the desired maximum peak pixel signal count in a way substantially similar to that of process 820. At process 930 for determining desirability of turning off sensor, the EBCCD sensor should be turned off if $N_{peakmeasured}$ exceeds $N_{peakmaximum}$ during M consecutive measurements and comparisons. M is a positive integer. At process 940 for turning off sensor, if turning off the sensor has been deemed desirable, the EBCCD sensor is turned off by adjusting $G_T$ to zero in a way similar to that of process 840.

At process 950 for adjusting $V_{bias}$, $V_{bias}$ is changed to reduce $N_{peakmeasured}$ to targeted peak pixel count $N_{peaktargeted}$, which is equal to or smaller than $N_{peakmaximum}$. The adjustment may be performed by changing settings of the digitally controlled power supply or by other means. For example, $V_{bias}$ can be adjusted to bring $N_{peakmeasured}$ back to being equal to $N_{peakmaximum}$ during the next $T_{gate}$ interval as shown in FIG. 4. Additionally, process 950 involves adjustment of photocathode bias $V_{pc}$, acceleration bias $V_{acc}$, or both $V_{pc}$ and $V_{acc}$. In bringing $N_{peakmeasured}$ back to being equal to or smaller than $N_{peakmaximum}$, many options may be implemented. For example, $N_{peaktargeted}$ is equal to $N_{peakmaximum}$ or to other preset value, such as $N_{avg}$. In any event, the adjustment may use the scaling algorithm as discussed above or other means. Sometimes, the adjustment cannot effectively bringing $N_{peakmeasured}$ back to being equal to or lower than $N_{peakmaximum}$. For example, the scaling algorithm usually works well if both $N_{peakmeasured}$ and $N_{peaktargeted}$ fall between $N_{linearlow}$ and $N_{linearhigh}$, and intensity of incoming photons received by the EBCCD sensor does not change substantially within a short period of time. If either condition is not satisfied, $N_{peakmeasured}$ usually cannot be effectively corrected. Consequently, during the next performance of processes 910 and 920, $N_{peakmeasured}$ remains larger than $N_{peakmaximum}$. As discussed above for process 930, if the correction remains unsatisfactory for M times, the sensor should be turned off. Upon turn-off, the sensor may require manual reset to restart or can utilize an automatic reset to restart when a preset criterion or criteria are satisfied.

Figure 10:
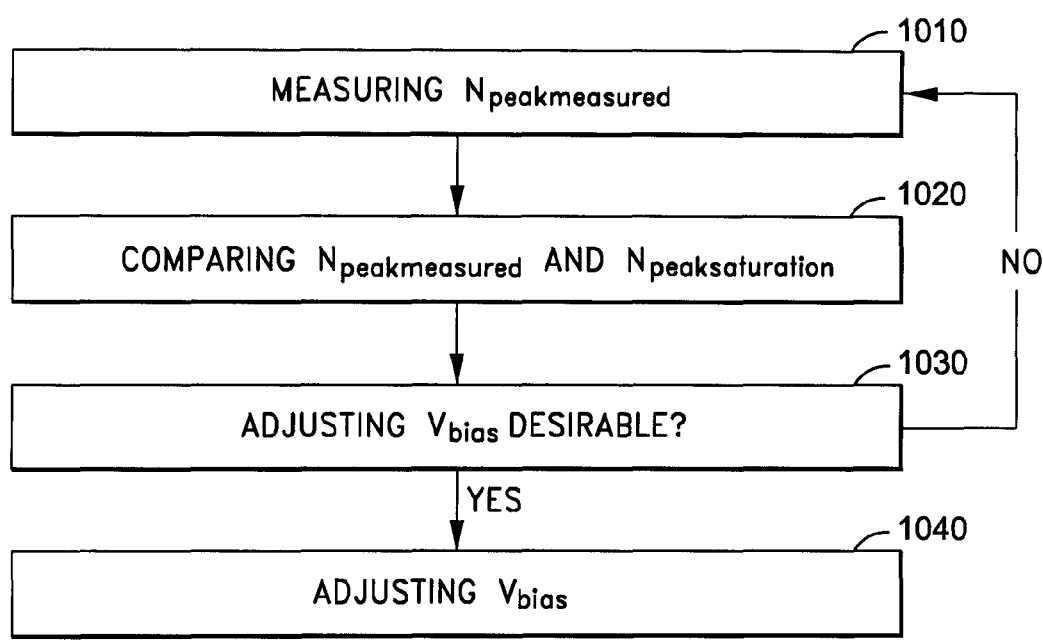
FIG. 10 is a simplified diagram for prevention of saturation.

FIG. 10 is a simplified diagram for prevention of saturation according to yet another embodiment of the present invention. This diagram is merely an illustration, which should not unduly limit the scope of the claims. One of ordinary skill in the art would recognize many variations, alternatives, and modifications. The method for prevention of saturation includes process 1010 for measuring peak pixel signal count $N_{peakmeasured}$, process 1020 for comparing peak pixel signal count $N_{peakmeasured}$ and saturation peak pixel signal count $N_{peaksaturation}$, process 1030 for determining desirability of adjusting $V_{bias}$, and process 1040 for adjusting $V_{bias}$. Although the above has been shown using a selected sequence of processes, there can be many alternatives, modifications, and variations. For example, some of the processes may be expanded and/or combined. Process 1020 for comparing measured peak pixel signal count $N_{peakmeasured}$ and saturation peak pixel signal count $N_{peaksaturation}$, and process 1030 for determining desirability of adjusting $V_{bias}$ may be combined. Other processes may be inserted to those noted above. Depending upon the embodiment, the specific sequence of steps may be interchanged with others replaced. Further details of these elements are found throughout the present specification and more particularly below.

At process 1010 for measuring peak pixel signal count $N_{peakmeasured}$, the peak pixel signal count is determined in a way substantially similar to that of process 710. At process 1020 for comparing $N_{peakmeasured}$ and $N_{peaksaturation}$, the measured peak pixel signal count is compared with the saturation peak pixel signal count. The saturation peak pixel represents the onset of non-linear gain region where $G_T$ has a nonlinear relationship with $V_{bias}$. For example, $N_{peaksaturation}$ equals $N_{sat}$ as shown in FIG. 6. At process 1030 for determining desirability of adjusting $V_{bias}$, $V_{bias}$ should be changed if $N_{peakmeasured}$ exceeds $N_{peaksaturation}$. At process 1040 for adjusting $V_{bias}$, $V_{bias}$ is changed to reduce $N_{peakmeasured}$ to the targeted peak pixel signal count $N_{peaktargeted}$, which is equal to or smaller than $N_{peaksaturation}$. The adjustment may be performed by changing settings of the digitally controlled power supply or by other means. For example, $V_{bias}$ can be adjusted to bring $N_{peakmeasured}$ back to being equal to $N_{peaksaturation}$ during the next $T_{gate}$ interval as shown in FIG. 4. Additionally, process 1040 involves adjustment of photocathode bias $V_{pc}$, acceleration bias $V_{acc}$, or both $V_{pc}$ and $V_{acc}$. In bringing $N_{peakmeasured}$ back to being equal to or lower than $N_{peaksaturation}$, many options may be implemented. For example, $N_{peaktargeted}$ is equal to $N_{peaksaturation}$ or other preset value, such as $N_{avg}$. The adjustment may use the scaling algorithm as discussed above or other means. Additionally, process 1040 may be repeated to sequentially decrease $N_{peakmeasured}$ for a number of times to obtain a series of images under decremented gain values to assist in certain image analyses.

Figure 11:
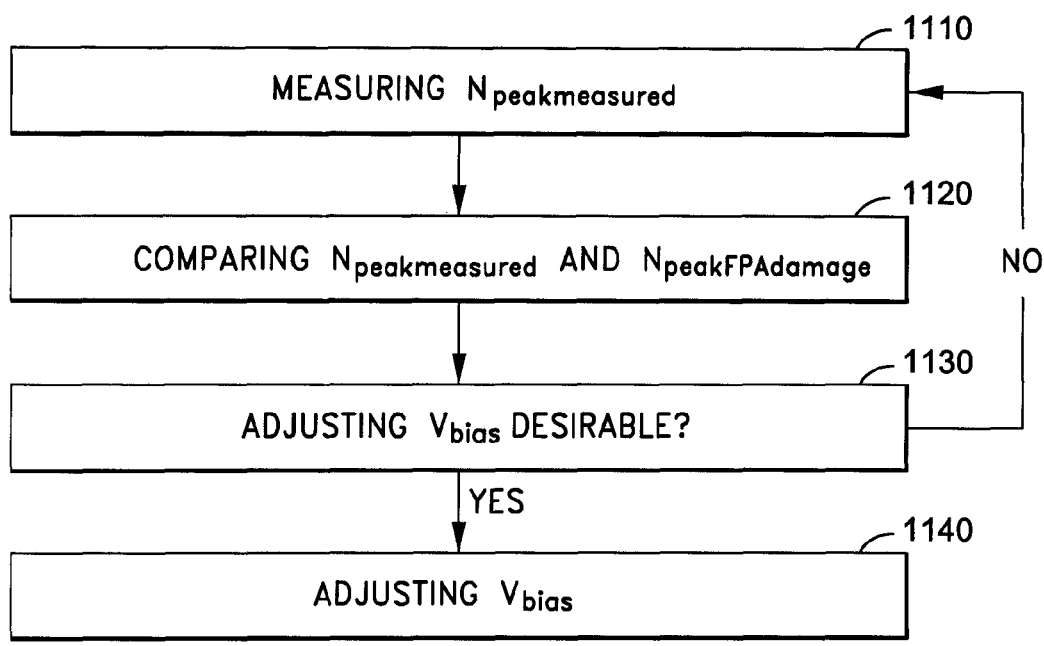
FIG. 11 is a simplified diagram for prevention of FPA pixel damage.

FIG. 11 is a simplified diagram for prevention of FPA pixel damage according to yet another embodiment of the present invention. This diagram is merely an illustration, which should not unduly limit the scope of the claims. One of ordinary skill in the art would recognize many variations, alternatives, and modifications. The method for prevention of FPA pixel damage includes process 1110 for measuring peak pixel signal count $N_{peakmeasured}$, process 1120 for comparing peak pixel signal count $N_{peakmeasured}$ and maximum peak pixel signal count $N_{peakFPAdamage}$ for preventing FPA pixel damage, process 1130 for determining desirability of adjusting $V_{bias}$, and process 1140 for adjusting $V_{bias}$. Although the above has been shown using a selected sequence of processes, there can be many alternatives, modifications, and variations. For example, some of the processes may be expanded and/or combined. Process 1120 for comparing $N_{peakmeasured}$ and $N_{peakFPAdamage}$ for preventing FPA pixel damage and process 1130 for determining desirability of adjusting $V_{bias}$ may be combined. Other processes may be inserted to those noted above. Depending upon the embodiment, the specific sequence of steps may be interchanged with others replaced. Further details of these elements are found throughout the present specification and more particularly below.

At process 1110 for measuring peak pixel signal count $N_{peakmeasured}$, the peak pixel signal count is determined in a way substantially similar to that of process 710. At process 1120 for comparing measured peak pixel signal count $N_{peakmeasured}$ and maximum peak pixel signal count $N_{peakFPAdamage}$ for preventing FPA pixel damage, $N_{peakmeasured}$ is compared with $N_{peakFPAdamage}$. $N_{peakFPAdamage}$ represents the onset of damage region for FPA pixels where FPA pixels are damaged. For example, in the damage region, pixel current densities overload the pixels and damage the pixels. $N_{peakFPAdamage}$ may be larger than $N_{sat}$ as shown in FIG. 6 or take other value. At process 1130 for determining desirability of adjusting $V_{bias}$, $V_{bias}$ should be changed if $N_{peakmeasured}$ exceeds $N_{peakFPAdamage}$. At process 1140 for adjusting $V_{bias}$, $V_{bias}$ is changed to reduce $N_{peakmeasured}$ to $N_{peaktargeted}$, which is equal to or smaller than $N_{peakFPAdamage}$. The adjustment may be performed by changing settings of the digitally controlled power supply or by other means. For example, $V_{bias}$ can be adjusted to bring $N_{peakmeasured}$ back to being equal to $N_{peakFPAdamage}$ during the next $T_{gate}$ interval as shown in FIG. 4. Additionally, process 1140 involves adjustment of photocathode bias $V_{pc}$, acceleration bias $V_{acc}$, or both $V_{pc}$ and $V_{acc}$. In bringing $N_{peakmeasured}$ back to being equal to or smaller than $N_{peakFPAdamage}$, many options may be implemented. For example, $N_{peakmeasured}$ may be reduced to be equal to $N_{peakFPAdamage}$ or other preset value, such as $N_{avg}$. The adjustment may use the scaling algorithm as discussed above or other means.

Figure 12:
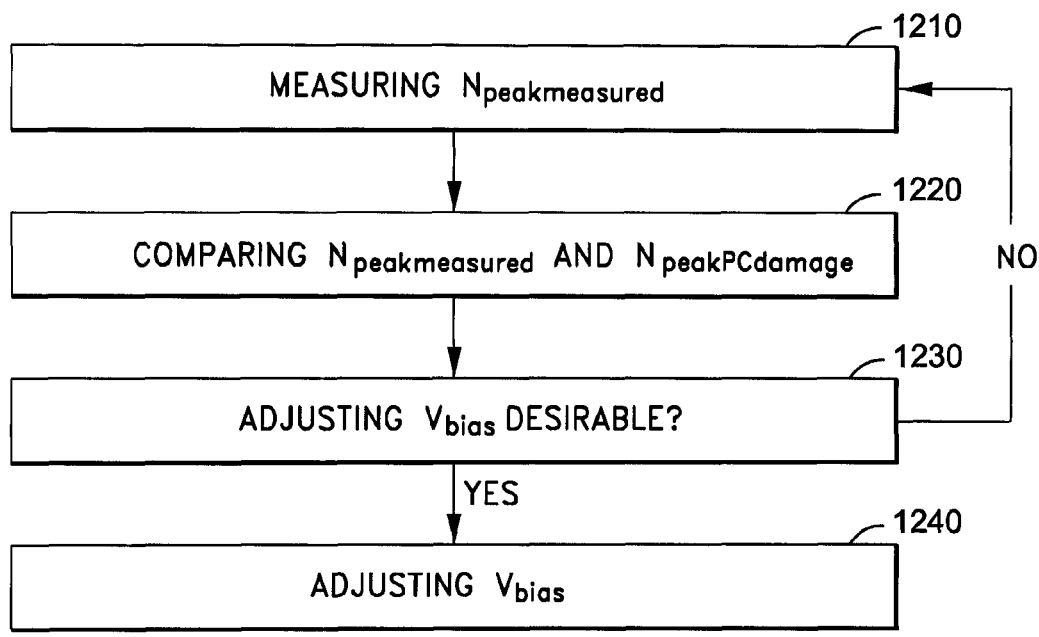
FIG. 12 is a simplified diagram for prevention of photocathode damage.

FIG. 12 is a simplified diagram for prevention of photocathode damage according to yet another embodiment of the present invention. This diagram is merely an illustration, which should not unduly limit the scope of the claims. One of ordinary skill in the art would recognize many variations, alternatives, and modifications. The method for prevention of photocathode damage includes process 1210 for measuring peak pixel signal count $N_{peakmeasured}$, process 1220 for comparing peak pixel signal count $N_{peakmeasured}$ and maximum peak pixel signal count $N_{peakPCdamage}$ for preventing photocathode damage, process 1230 for determining desirability of adjusting $V_{bias}$, and process 1240 for adjusting $V_{bias}$. Although the above has been shown using a selected sequence of processes, there can be many alternatives, modifications, and variations. For example, some of the processes may be expanded and/or combined. Process 1220 for comparing $N_{peakmeasured}$ and $N_{peakPCdamage}$ for preventing photocathode damage and process 1230 for determining desirability of adjusting $V_{bias}$ may be combined. Other processes may be inserted to those noted above. Depending upon the embodiment, the specific sequence of steps may be interchanged with others replaced. Further details of these elements are found throughout the present specification and more particularly below.

At process 1210 for measuring peak pixel signal count $N_{peakmeasured}$, the peak pixel signal count is determined in a way substantially similar to that of process 710. At process 1220 for comparing $N_{peakmeasured}$ and $N_{peakPCdamage}$ for preventing photocathode damage, $N_{peakmeasured}$ is compared with $N_{peakPCdamage}$. $N_{peakPCdamage}$ represents the onset of damage region for photocathode where the photocathode is damaged. For example, in the photocathode damage region, the photocathode is damaged by ions back-streaming to the photocathode when the pixel current density is high enough to sputter ions from the FPA. In another example, the photocathode damage can occur for excessive light input intensities. $N_{peakPCdamage}$ depends on the device characteristics of the EBCCD sensor. For example, $N_{peakPCdamage}$ is larger than $N_{sat}$ as shown in FIG. 6. At process 1230 for determining desirability of adjusting $V_{bias}$, $V_{bias}$ should be changed if $N_{peakmeasured}$ exceeds $N_{peakPCdamage}$. At process 1240 for adjusting $V_{bias}$, $V_{bias}$ is changed to reduce $N_{peakmeasured}$ to the targeted peak pixel signal count $N_{peaktargeted}$, which is equal to or smaller than $N_{peakPCdamage}$. The adjustment may be performed by changing settings of the digitally controlled power supply or by other means. For example, $V_{bias}$ can be adjusted to bring $N_{peakmeasured}$ back to being equal to $N_{peakPCdamage}$ during the next $T_{gate}$ interval as shown in FIG. 4. Additionally, process 1240 involves adjustment of photocathode bias $V_{pc}$, acceleration bias $V_{acc}$, or both $V_{pc}$ and $V_{acc}$. In bringing $N_{peakmeasured}$ back to being equal to or smaller than $N_{peakPCdamage}$, many options may be implemented. For example, $N_{peaktargeted}$ is equal to $N_{peakPCdamage}$ or other preset value, such as $N_{avg}$. The adjustment may use the scaling algorithm as discussed above or other means.

Figure 13:
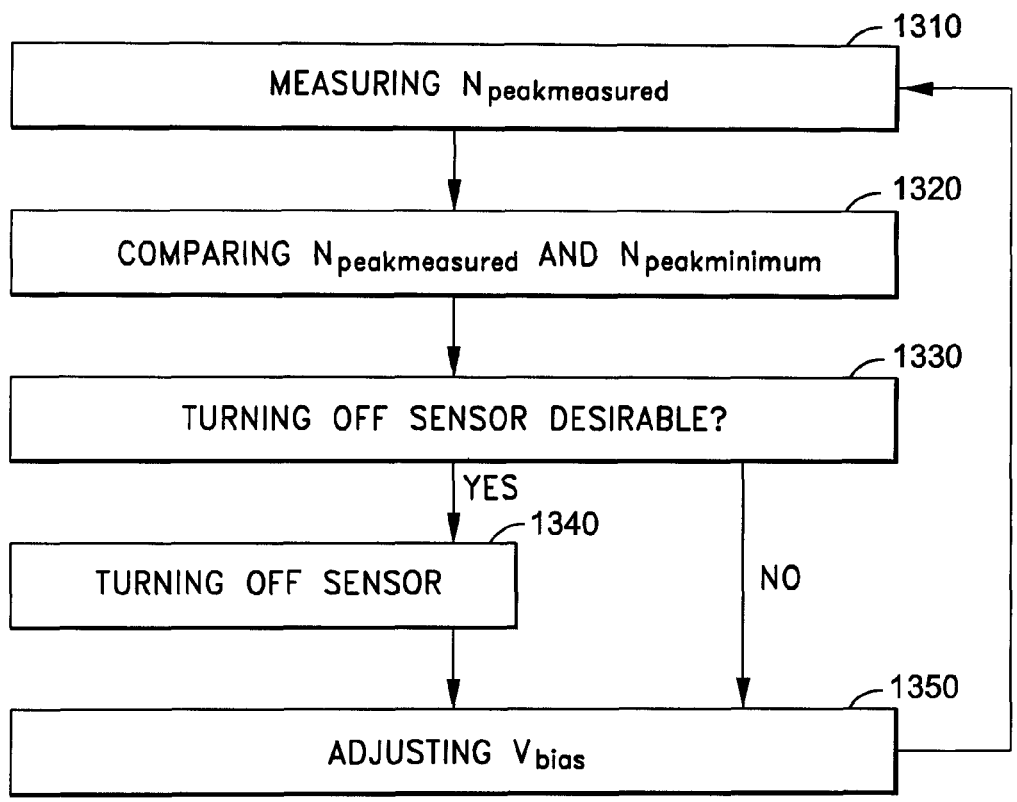
FIG. 13 is a simplified diagram for EBCCD lifetime extension.

FIG. 13 is a simplified diagram for EBCCD lifetime extension according to yet another embodiment of the present invention. This diagram is merely an illustration, which should not unduly limit the scope of the claims. One of ordinary skill in the art would recognize many variations, alternatives, and modifications. The method for EBCCD lifetime extension includes process 1310 for measuring peak pixel signal count $N_{peakmeasured}$, process 1320 for comparing measured peak pixel signal count $N_{peakmeasured}$ and the noise peak pixel signal count $N_{peaknoise}$, process 1330 for determining desirability of turning off sensor, process 1340 for turning off sensor, and process 1350 for adjusting $V_{bias}$. Although the above has been shown using a selected sequence of processes, there can be many alternatives, modifications, and variations. For example, some of the processes may be expanded and/or combined. Process 1330 for determining desirability of turning off sensor and process 1340 for turning off sensor may be combined. Other processes may be inserted to those noted above. Depending upon the embodiment, the specific sequence of steps may be interchanged with others replaced. Further details of these elements are found throughout the present specification and more particularly below.

At process 1310 for measuring peak pixel signal count $N_{peakmeasured}$, the peak pixel signal count is determined in a way substantially similar to that of process 710 or process 810. At process 1320 for comparing $N_{peakmeasured}$ and $N_{peaknoise}$, the measured peak pixel signal count is compared with the previously-determined background peak noise count. $N_{peaknoise}$ may be chosen to be slightly larger than the actual noise count. At process 1330 for determining desirability of turning off sensor, the EBCCD sensor should be turned off if $N_{peakmeasured}$ is less than $N_{peaknoise}$ during M consecutive measurements. M is a positive integer. At process 1340 for turning off sensor, if turning off the sensor has been deemed desirable, the EBCCD sensor is turned off by adjusting $G_T$ to zero in a way similar to that of process 840.

At process 1350 for adjusting $V_{bias}$, $V_{bias}$ is changed to increase $N_{peakmeasured}$ to the targeted peak pixel signal count $N_{peaktargeted}$, which is equal to or larger than $N_{peakminimum}$. The adjustment may be performed by changing settings of the digitally controlled power supply or by other means. For example, $V_{bias}$ can be adjusted to bring $N_{peakmeasured}$ back to being equal to $N_{peakminimum}$ during the next $T_{gate}$ interval as shown in FIG. 4. Additionally, process 1350 involves adjustment of photocathode bias $V_{pc}$, acceleration bias $V_{acc}$, or both $V_{pc}$ and $V_{acc}$. In bringing $N_{peakmeasured}$ back to being equal to or larger than $N_{peakminium}$, many options may be implemented. For example, $N_{peakmeasured}$ may be increased to be equal to $N_{peakminimum}$ or other preset value, such as $N_{avg}$. The adjustment may use the scaling algorithm as discussed above or other means. Sometimes, the adjustment cannot effectively bring $N_{peakmeasured}$ back to being equal to or higher than $N_{peakminimum}$ for various reasons. For example, the imagining object is sending almost no incoming photons to the EBCCD sensor. Consequently, during the next performance of processes 1310 and 1320, $N_{peakmeasured}$ remains lower than $N_{peakminimum}$. As discussed above for process 1330, if the correction remains unsatisfactory for M consecutive times, the sensor should be turned off. By turning off the EBCCD sensor, this embodiment of the present invention can prevent current during periods of inactivity for the EBCCD sensor while the EBCCD sensor is still powdered up.

Figure 14:
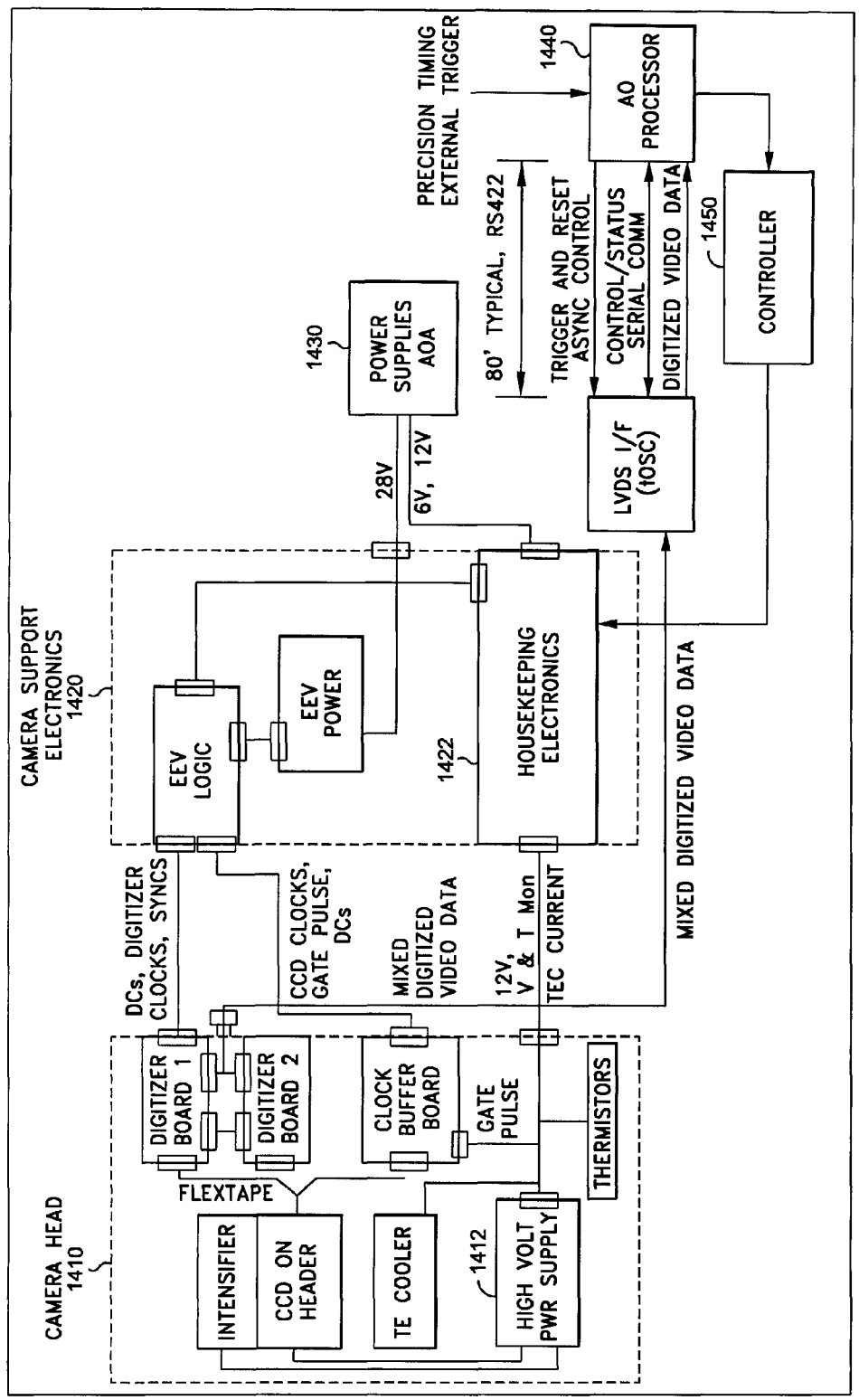
FIG. 14 is a simplified block diagram of the EBCCD sensor system.

FIG. 14 is a simplified block diagram of the EBCCD sensor system according to one embodiment of the present invention. This diagram is merely an illustration, which should not unduly limit the scope of the claims. One of ordinary skill in the art would recognize many variations, alternatives, and modifications. The EBCCD sensor system includes a camera head 1410 including high voltage power supply 1412, camera support electronics 1420 including housekeeping electronics 1422, a low voltage digital signal interface, an adaptive optics associates ("AOA") wavefront sensor, power supply for AOA 1430, AO Processor 1440, and a controller 1450. Controller 1450 instructs housekeeping electronics 1422 to send signals to high voltage power supply 1412. In response, high voltage power supply 1412 provides camera head 1410 with desired biases $V_{pc}$ and $V_{acc}$ according to various embodiments of the present invention as discussed above and shown in FIGS. 7, 8, 8A, and 9-14.

Controller 1450 may uses different ways to regulate the voltage levels of $V_{pc}$ and $V_{acc}$. For example, the controller 1450 includes a computer storing calibration data of the EBCCD sensor and a computer program. The computer program varies according to different embodiments of the present invention, or incorporates some or all of embodiments of the present invention into a single set of computer code. For instance, the computer code for automatic gain control directs a processor to perform the inventive steps including measuring peak pixel signal count $N_{peakmeasured}$, comparing peak pixel signal count $N_{peakmeasured}$ and desired peak pixel signal count $N_{peakdesired}$, determining desirability of adjusting $V_{bias}$, adjusting $V_{bias}$, and determining desirability for additional measurement of $N_{peakmeasured}$. The computer code can be implemented with various types of computers such as Pentium PC and various types of computer languages such as C++ and MATLAB. One of ordinary skill in the art would recognize other variation, modifications, and alternatives.

The present invention has many advantages. Certain embodiments of the present invention relate to novel protective methods of operating the EBCCD sensor, a high-sensitivity, low-noise, and expensive focal plane array sensor. Some embodiments of the present invention provide methods for operation that automatically controls the EBCCD gain at a high rate. This allows for sensor damage protection from too much light, for extension of sensor service life by reducing gain in periods of non-use, for automatic adjustment to compensate for variations in scene brightness, or any combination thereof. Moreover, in certain embodiments of the present invention, the gain control can be done rapidly so as to avoid damage and other performance issues before they get out of control. For example, in the Airborne Laser System of Lockheed Martin Corporation, the gain control of the EBCCD sensor usually takes only one time step, such as 200 μs.

It is understood the examples and embodiments described herein are for illustrative purposes only and that various modifications or changes in light thereof will be suggested to persons skilled in the art and are to be included within the spirit and purview of this application and scope of the appended claims. For example, certain embodiments of the present invention applies not only to EBCCD sensor but also to any similarly constructed sensor which can be biased to control the sensor gain. As another example, the calibration of the EBCCD sensor may be repeated during the operation of the EBCCD sensor as described in FIGS. 7-13. For instance, for very precise automatic control the calibration of the EBCCD sensor as shown in FIGS. 5 and 5A may be repeated after the sensor is in actual use accumulatively for 25 hours.

What is claimed is:

1. An electron bombarded charge coupled device (EBCCD) sensor with automatic gain control for maintaining the EBCCD sensor within a predetermined gain or corresponding pixel count range, comprising:
   i) a means to image a spatially distributed photon distribution onto a photocathode whose purpose is to convert this into a similar spatial distribution of photoelectrons,
   ii) a means to adjust the photocathode's conversion efficiency from input photons to output photoelectrons by means of adjusting a photocathode bias voltage,
   iii) a means to accelerate photoelectron spatial distribution onto a focal plane array possessing one or more pixels where a number of electrons produced in an array material per incoming photoelectron may be varied by adjusting an acceleration bias voltage,
   iv) a means to rapidly collect electrons produced in each pixel as charge and, with analog to digital conversion, convert these to ray signal pixel counts which are promptly swept out and placed in computer memory as the data raw signal array for that time step,
   v) if desired, a means to automatically subtract background noise pixel counts array from the raw signal count array and, after changing each negative value to zero, to arrive at a true signal pixel counts array for the timestep,
   vi) a means to search desired pixel counts array for the pixel count of the pixel with maximum counts, $N_{pixmax}$, and the average count for all pixels, $N_{pixavg}$,
   vii) a means to compare one or more of the pixel counts with certain pre-chosen counts that are stored in computer memory relating to the lower and upper bound counts for linear gain in the sensor, $N_{satmin}$ and $N_{satmax}$, respectively, and for the noise floor counts that would pertain if no signal photons were entering the sensor during a period of non-use, $N_{pixbkgnd}$, an upper limit count beyond which certain sensor components would be damaged if it were allowed to persist for a period of time, $N_{pixdam}$,
   viii) a means to store criteria for certain changes in one or both bias voltages that are commanded by those criteria to effect sensor automatic control as listed below,
   ix) a means to generate and store a required look-up table of bias voltages, or the functional equivalent equations, by means of prior calibration of the sensor wherein the photons from a light source of known spatial intensity distribution impinges on the sensor and the gains and pixel counts are recorded for various bias voltages,
   x) a means to determine the required bias voltages for certain control functions by using the feature values as determined in (vi) for the purpose of interpolation of extrapolation in the table of (ix),
   xi) a means to promptly adjust one or both of the voltages with digitally controlled power supplies according to values determined in (x),
   xii) a means for the sensor to cycle into a repeat of the above steps as it responds to a master clock signal that drives it at a repetition rate.

2. An electron bombarded charge coupled device (EBCCD) sensor with automatic gain control for maintaining the EBCCD sensor within a predetermined gain or corresponding pixel count range, comprising
   i) a means to set a control algorithm to compare the maximum pixels count at each time step, $N_{pixmax}$, to see if it's value is greater than a desired minimum count, $N_{setmin}$, and less than a maximum desired count, $N_{setmax}$;
ii) a means to maintain same bias voltages for the next time step if (i) is true or to adjust the bias voltages if (i) is untrue in order to maintain gain in the prescribed range,
iii) a means to adjust the bias voltages to that previously determined which sets the sensor gain to mid-range, i.e., to obtain a $N_{pixmax}$ value that is midway between $N_{setmin}$, and $N_{setmax}$.

3. An electron bombarded charge coupled device (EB-CCD) sensor with automatic gain control for maintaining the EBCCD sensor within a predetermined gain region or corresponding pixel count range, comprising
i) a means to set a control algorithm to compare maximum pixels count at each time step, $N_{pixmax}$, to see if its value is greater than a desired minimum count that corresponds to a lowest region of linear gain, $N_{setlinmin}$, and less than a maximum desired count that marks an uppermost region of linear gain, $N_{setlinmax}$;
ii) a means to maintain same bias voltages for the next time step if (i) is true or to adjust the bias voltages if (i) is untrue in order to maintain gain in the prescribed range,
iii) a means to adjust the bias voltages to that previously determined which sets the sensor gain to mid-range, i.e. to obtain a $N_{pixmax}$ value that is midway between $N_{setlinmin}$, and $N_{setlinmax}$.

4. An electron bombarded charge coupled device (EB-CCD) sensor with automatic gain control for maintaining the EBCCD sensor within a predetermined gain or corresponding pixel count range, comprising
i) a means to set a control algorithm to compare a maximum pixels count at each time step, $N_{pixmax}$, to see if it's value is less than a count that corresponds to the one which accompanies an onset of overfilling one or more pixel wells, sensor well fill gain, $N_{pixfull}$,
ii) a means to maintain same bias voltages for the next time step if (i) is true or to adjust the bias voltages if (i) is untrue in order to maintain gain below that for which saturation would occur,
iii) a means to adjust the bias voltages to that previously were chosen which sets the sensor gain to a $N_{pixmax}$ value that provides a value $N_{setsat}$, suitably below that which produced the well overfill value $N_{pixfull}$.

5. An electron bombarded charge coupled device (EB-CCD) sensor with automatic gain control for maintaining the EBCCD sensor below a predetermined gain or corresponding pixel count range, comprising
i) a means to set a control algorithm to compare a maximum pixels count at each time step, $N_{pixmax}$, to see if it's value is less than a count that corresponds to the one which accompanies an onset of a sensor damage gain, $N_{pixdam}$,
ii) a means to maintain same bias voltages for the next time step if (i) is true or to adjust the bias voltages if (i) is untrue in order to maintain gain below that for which damage would occur,
iii) a means to adjust the bias voltages to that previously were chosen which sets the sensor gain to a $N_{pixmax}$ value that provides a value $N_{setdam}$, suitably below that which produced the saturation value $N_{pixdam}$.

6. An electron bombarded change coupled device (EB-CCD) sensor with automatic gain control for maintaining the operation of the sensor below a quantum efficiency value or its corresponding pixel count value where damage of the sensor would occur, comprising:
i) a means to set a control algorithm to compare a maximum pixels count at each time step, $N_{pixmax}$, to see if it's value is less than a count that corresponds to one which accompanies an onset of photocathode damage gain, $N_{pixpedam}$, stemming from excessive, localized emission charge density
ii) a means to maintain a same photocathode bias voltage for the next time step if (i) is true or to adjust the bias voltage if (i) is untrue in order to maintain gain below that for which damage would occur,
iii) a means to adjust the photocathode bias voltage to that previously chosen which sets the sensor gain to a $N_{pixmax}$ value that provides a value $N_{setpedam}$, suitably below that which produced the photocathode damage value $N_{pixpedam}$.

7. An electron bombarded charge coupled device (EB-CCD) sensor with automatic gain control for maintaining the sensor operation below a localized current display value on the Focal Plane Array (FPA) or its corresponding pixel count value where damage of the sensor would occur, comprising:
i) a means to set a control algorithm to compare a maximum pixels count at each time step, $N_{pixmax}$, to see if it's value is less than a count that corresponds to the one which accompanies an onset of a FPA damage gain, $N_{pixpadam}$, stemming from excessive, localized charge density impingement onto the FPA
ii) a means to maintain the same photocathode bias voltage for the next time step if (i) is true or to adjust the bias voltage if (i) is untrue in order to maintain gain below that for which damage would occur,
iii) a means to adjust the FPA bias voltage to that previously chosen which sets the sensor gain to a $N_{pixmax}$ value that provides a value $N_{setpadam}$, suitably below that which produced the photocathode damage value $N_{pixfpadam}$.

8. An electron bombarded charge coupled device (EB-CCD) sensor having automatic gain control to maintain the sensor operation below a localized current density value on the Focal Plane Array (FPA) or its corresponding pixel count value comprising:
i) a means to set a control algorithm to compare a maximum pixels count at each time step, $N_{pixmax}$, to see it it's value is less than a count that corresponds to the one which accompanies an onset of an ion backsetter damage gain, $N_{pixbkscatdam}$, stemming from excessive, localized charge density impingement onto the FPA
ii) a means to maintain the same acceleration bias voltage for the next time step if (i) is true or to adjust the bias voltage if (i) is untrue in order to maintain gain below that for which such damage would occur,
iii) a means to adjust a photocathode to FPA acceleration bias voltage to that previously chosen which sets a sensor gain to $N_{pixmax}$ value that provides a value $N_{setbkscatdam}$ suitably below that which produced a photocathode damage value $N_{pixbkscatdam}$.

9. An electron bombarded charge coupled device (EB-CCD) sensor having automatic gain control to maintain the sensor operation below a gain region or its corresponding pixel count range when a shortening of the sensor life would occur should no signal be present except only background noise photoelectrons, comprising:
i) a means to set a control algorithm to compare a maximum pixels count at each time step, $N_{pixmax}$, to see if it's value is less than or equal to a count that corresponds to one which indicates that only background photoelectrons and no signal photoelectrons are present, $N_{pixbkgnd}$, ii) a means to count each successive time step when (i) occurs and at a pre-chosen value M to adjust the bias voltages to give zero quantum efficiency and zero gain, iii) a means to maintain same "sleep" bias voltages for the next time step if (i) is true or to adjust the bias voltages to their original values present during (i) if (i) is untrue in order to automatically "awake" the sensor when a true signal appears.

10. An electron bombarded charge coupled device (EB-CCD sensor having automatic gain control to latch the sensor operation off after it fails on a prescribed number of successive time steps to either exceed or be less than a pre-chosen desired gain or corresponding maximum pixel count, comprising:

i) a means to set a control algorithm to compare a maximum pixels count at each time step, $N_{pixmax}$, to see if it's value is less than or greater than a shutoff count that is pre-chosen, $N_{pixshutoff}$, within a certain chosen range $\pm \Delta N$, i.e. between a lower value $N_{pixshutoff}$ $-\Delta N$ and an upper value $N_{pixshutoff}$ $+\Delta N$ ii) a means to count each successive time step with (i) occurs and at a pre-chosen value M to adjust the bias voltages to give zero quantum efficiency and zero gain, iii) a means to maintain the same "sleep" bias voltages for the following time steps and only resume operation when a manual reset to start is effected.

11. A method for controlling gain of a sensor, the sensor having a bias able photo emitter, gain control, and a plurality of pixels for reading out photocounts per pixel within a predetermined time, the method comprising:

operating a sensor configured to receive a first number of photons and generate a second number of signal electrons according to a sensor gain, the sensor including an optic-electro system and an electro-electro system, the optic-electro system being biased by a control bias and configured to emit a third number of photoelectrons in response to the first number of photons according to a quantum efficiency, the third number of photoelectrons being accelerated by an acceleration bias, the electro-electro system having at least one pixel and configured to receive the third number of photoelectrons and generate the second number of signal electrons;

measuring at least one number of signal electrons corresponding to some or all of the at least one pixel;

processing the measured at least one number of signal electrons and determining a measured peak number of signal electrons based on the processed measured at least one number of signal electrons;

associating the measured peak number of signal electrons with a desired range for peak number of signal electrons;

if the measured peak number of signal electrons is outside the desired range for peak number of signal electrons, retrieving a voltage value for a sensor bias from a memory system and adjusting the sensor bias to the voltage value, the voltage value corresponding to a targeted peak number of signal electrons.

12. The method of claim 11 wherein the adjusting the sensor bias provides an automatic gain control of the sensor.

13. The method of claim 11 wherein the sensor is an EBCCD sensor.

14. The method of claim 11 wherein the measuring, the processing, the associating, the retrieving and the adjusting are performed within a time period equal to or short than 200 µs.

15. The method of claim 11, wherein the sensor bias is the control bias, the acceleration bias, or a combination of the control bias and the acceleration bias.

16. The method of claim 15 wherein the desired range for peak number of signal electrons comprises at least one desired number.

17. The method of claim 16 wherein at the at least one desired number, the sensor gain has a substantially linear relationship with the sensor bias.

18. The method of claim 16 wherein the targeted peak number of signal electron lies within the desired range for peak number of signal electrons.

19. A method for reducing gain of a sensor, the sensor having a bias able photo emitter, gain control, and a plurality of pixels for reading out photocounts per pixel within a predetermined time, the method comprising:

operating a sensor configured to receive a first number of photons and generate a second number of signal electrons according to a sensor gain, the sensor including an optic-electro system and an electro-electro system, the optic-electro system being biased by a control bias and configured to emit a third number of photoelectrons in response to the first number of photons according to a quantum efficiency, the third number of photoelectrons being accelerated by an acceleration bias, the electro-electro system having at least one pixel and configured to receive the third number of photoelectrons and generate the second number of signal electrons;

measuring at least one number of signal electrons corresponding to some or all of the at least one pixel;

processing the measured at least one number of signal electrons and determining a first measured selected number of signal electrons based on the processed measured at least one number of signal electrons;

associating the first measured selected number of signal electrons with a desired number of signal electrons;

if the first measured selected number of signal electrons exceeds the desired number of signal electrons, retrieving a voltage value for a sensor bias from a memory system and adjusting the sensor bias to the retrieved voltage value, the retrieved voltage value corresponding to a targeted number of signal electrons;

wherein the targeted number of signal electrons equals zero.

20. The method of claim 19 wherein the adjusting comprises latching off the sensor.

21. The method of claim 19 wherein the sensor is an EBCCD sensor.

22. The method of claim 19 wherein the measuring, the processing, the associating, the retrieving and the adjusting are performed within a time period equal to or shorter than 200 µs.

23. The method of claim 19, wherein the sensor bias is the control bias, the acceleration bias, or a combination of the control bias and the acceleration bias.

24. The method of claim 23 wherein at the desired number of signal electrons, the sensor gain has a substantially linear relationship with the sensor bias.

25. The method of claim 23 wherein the desired number of signal electrons equals a saturation number of signal electrons at the onset of a saturation region of the sensor.

26. The method of claim 23 wherein the retrieved voltage value is equal to or smaller than a cutoff voltage value for the sensor bias at the onset of a cutoff region of the sensor.

27. The method of claim 19 further comprising:
increasing the sensor bias from the retrieved voltage value to a test voltage value;
obtaining a second measured selected number of signal electrons at the test voltage value;
associating the second measured selected number of signal electrons with the desired number of signal electrons.

28. A method for iteratively reducing gain of a sensor, the sensor having a bias able photo emitter, gain control, and a plurality of pixels for reading out photocounts per pixel within a predetermined time, the method comprising:
operating a sensor configured to receive a first number of photons and generate a second number of signal electrons according to a sensor gain, the sensor including an optic-electro system and an electro-electro system, the optic-electro system being biased by a control bias and configured to emit a third number of photoelectrons in response to the first number of photons according to a quantum efficiency, the third number of photoelectrons being accelerated by an acceleration bias, the electro-electro system having at least one pixel and configured to receive the third number of photoelectrons and generate the second number of signal electrons;
measuring at least one number of signal electrons corresponding to some or all of the at least one pixel;
processing the measured at least one number of signal electrons and determining a measured selected number of signal electrons based on the processed measured at least one number of signal electrons;
associating the measured selected number of signal electrons with a desired number of signal electrons;
if the measured selected number of signal electrons exceeds the desired number of signal electrons for a predetermined number of consecutive times, retrieving a first voltage value for a sensor bias from a memory system and adjusting the sensor bias to the first retrieved voltage value, the first retrieved voltage value corresponding to a first targeted number of signal electrons;
if the measured selected number of signal electrons is equal to or smaller than the desired number of signal electrons, or if the measured selected number of signal electrons exceeds the desired number of signal electrons for less than the predetermined number of consecutive times, retrieving a second voltage value for the sensor bias from the memory system and adjusting the sensor bias to the second retrieved voltage value, the second retrieved voltage value corresponding to a second targeted number of signal electrons;
wherein
the first targeted number of signal electrons equals zero;
the second targeted number of signal electrons is larger than zero.

29. The method of claim 28 wherein the adjusting the sensor bias provides m-trial latch-off for the sensor.

30. The method of claim 28 wherein the sensor is an EBCCD sensor.

31. The method of claim 28 wherein the measuring, the processing, the associating, the retrieving and the adjusting are performed within a time period equal to or shorter than 200 µs.

32. The method of claim 28 wherein the predetermined number of consecutive times is equal to or larger than 50.

33. The method of claim 28, wherein the sensor bias is the control bias, the acceleration bias, or a combination of the control bias and the acceleration bias.

34. The method of claim 33, wherein at the second retrieved voltage value, the sensor gain has a substantially linear relationship with the sensor bias.

35. The method of claim 33, wherein the first retrieved voltage value is equal to or smaller than a cutoff voltage value for the sensor bias at the onset of a cutoff region of the sensor.

36. A method for reducing saturation of a sensor, the sensor having a bias able photo emitter, gain control, and a plurality of pixels for reading out photocounts per pixel within a predetermined time, the method comprising:
operating a sensor configured to receive a first number of photons and generate a second number of signal electrons according to a sensor gain, the sensor including an optic-electro system and an electro-electro system, the optic-electro system being biased by a control bias and configured to emit a third number of photoelectrons in response to the first number of photons according to a quantum efficiency, the third number of photoelectrons being accelerated by an acceleration bias, the electro-electro system having at least one pixel and configured to receive the third number of photoelectrons and generate the second number of signal electrons;
measuring at least one number of signal electrons corresponding to some or all of the at least one pixel;
processing the measured at least one number of signal electrons and determining a measured selected number of signal electrons based on the processed measured at least one number of signal electrons;
associating the measured selected number of signal electrons with a desired number of signal electrons, the desired number of signal electrons representing the onset of a non-linear gain region of the sensor;
if the measured selected number of signal electrons exceeds the desired number of signal electrons, retrieving a voltage value for a sensor bias from a memory system and adjusting the sensor bias to the retrieved voltage value, the retrieved voltage value corresponding to a targeted number of signal electrons.

37. The method of claim 36 wherein the adjusting the sensor bias prevents saturation of the sensor.

38. The method of claim 36 wherein the sensor is an EBCCD sensor.

39. The method of claim 36 wherein the measuring, the processing, the associating, the retrieving and the adjusting are performed within a time period equal to or shorter than 200 µs.

40. The method of claim 36, wherein the sensor bias is the control bias, the acceleration bias, or a combination of the control bias and the acceleration bias.

41. The method of claim 40 wherein at the desired number of signal electrons, a gain of the sensor has a substantially nonlinear relationship with the sensor bias.

42. The method of claim 40 wherein at the targeted number of signal electrons, a gain of the sensor has a substantially linear relationship with the sensor bias.

43. A method of reducing pixel damage of a sensor, the sensor having a bias able photo emitter, gain control, and a plurality of pixels for reading out photocounts per pixel within a predetermined time, the method comprising:
operating a sensor configured to receive a first number of photons and generate a second number of signal electrons according to a sensor gain, the sensor including an optic-electro system and an electro-electro system, the optic-electro system being biased by a control bias and configured to emit a third number of photoelectrons in response to the first number of photons according to a quantum efficiency, the third number of photoelectrons being accelerated by an acceleration bias, the electro-electro-system having at least one pixel and configured to receive the third number of photoelectrons and generate the second number of signal electrons;

measuring at least one number of signal electrons corresponding to some or all of the at least one pixel;

processing the measured at least one number of signal electrons and determining a measured selected number of signal electrons based on the processed measured at least one number of signal electrons;

associating the measured selected number of signal electrons with a desired number of signal electrons, the desired number of signal electrons representing the onset of a damage region for the electro-electro-system;

if the measured selected number of signal electrons exceeds the desired number of signal electrons, retrieving a voltage value for a sensor bias from a memory system and adjusting the sensor bias to the retrieved voltage value, the retrieved voltage value corresponding to a targeted number of signal electrons.

44. The method of claim 43 wherein the adjusting the sensor bias prevents Focal Plane Array (FPA) pixel damage of the sensor.

45. The method of claim 43 wherein the sensor is an electron bombarded charge coupled device (EBCCD) sensor.

46. The method of claim 43 wherein the measuring, the processing, the associating, the retrieving and the adjusting are performed within a time period equal to or shorter than 200 μs.

47. The method of claim 43, wherein the sensor bias is the control bias, the acceleration bias, or a combination of the control bias and the acceleration bias.

48. The method of claim 47 wherein at the desired number of signal electrons, the sensor gain has a substantially nonlinear relationship with the sensor bias.

49. The method of claim 47 wherein at the targeted number of signal electrons, the sensor gain has a substantially linear relationship with the sensor bias.

50. A method of reducing photocathode damage of a sensor, the sensor having a bias able photo emitter, gain control, and a plurality of pixels for reading out photocounts per pixel within a predetermined time, the method comprising:

operating a sensor configured to receive a first number of photons and generate a second number of signal electrons according to a sensor gain, the sensor including an optic-electro system and an electro-electro system, the optic-electro system being biased by a control bias and configured to emit a third number of photoelectrons in response to the first number of photons according to a quantum efficiency, the third number of photoelectrons being accelerated by an acceleration bias, the electro-electro system having at least one pixel and configured to receive the third number of photoelectrons and generate the second number of signal electrons;

measuring at least one number of signal electrons corresponding to the at least one pixel;

processing the measured at least one number of signal electrons and determining a measured selected number of signal electrons based on the processed measured at least one number of signal electrons;

associating the measured selected number of signal electrons with a desired number of signal electrons, the desired number of signal electrons representing the onset of a damage region for the electro-electro system;

if the measured selected number of signal electrons exceeds the desired number of signal electrons, retrieving a voltage value for a sensor bias from a memory system and adjusting the sensor bias to the retrieved voltage value, the retrieved voltage value corresponding to a targeted number of signal electrons.

51. The method of claim 50 wherein the adjusting the sensor bias prevents photocathode damage of the sensor.

52. The method of claim 50 wherein the sensor is an EBCCD sensor.

53. The method of claim 50 wherein the measuring, the processing, the associating, the retrieving and the adjusting are performed within a time period equal to or shorter than 200 μs.

54. The method of claim 50, wherein the sensor bias is the control bias, the acceleration bias, or a combination of the control bias and the acceleration bias.

55. The method of claim 54 wherein at the desired number of signal electrons, the sensor gain has a substantially nonlinear relationship with the sensor bias.

56. The method of claim 54 wherein at the targeted number of signal electrons, the sensor gain has a substantially linear relationship with the sensor bias.

57. A method for extending lifetime of a sensor, the sensor having a bias able photo emitter, gain control, and a plurality of pixels for reading out photocounts per pixel within a predetermined time, the method comprising:

operating a sensor configured to receive a first number of photons and generate a second number of signal electrons according to a sensor gain, the sensor including an optic-electro system and an electro-electro system, the optic-electro system being biased by a control bias and configured to emit a third number of photoelectrons in response to the first number of photons according to a quantum efficiency, the third number of photoelectrons being accelerated by an acceleration bias, the electro-electro system having at least one pixel and configured to receive the third number of photoelectrons and generate the second number of signal electrons;

measuring at least one number of signal electrons corresponding to some or all of the at least one pixel;

processing the measured at least one number of signal electrons and determining a measured selected number of signal electrons based on the processed measured at least one number of signal electrons;

associating the measured selected number of signal electrons with a desired number of signal electrons;

if the measured selected number of signal electrons is equal to or smaller than the desired number of signal electrons for a predetermined number of consecutive times, retrieving a first voltage value for a sensor bias from a memory system and adjusting the sensor bias to the first retrieved voltage value, the first retrieved voltage value corresponding to a first targeted number of signal electrons;

if the measured selected number of signal electrons exceeds the desired number of signal electrons, or if the measured selected number of signal electrons is equal to or smaller than the desired number of signal electrons for less than the predetermined number of consecutive times, retrieving a second voltage value for the sensor bias from the memory system and adjusting the sensor bias to the second retrieved voltage value, the second retrieved voltage value corresponding to a second targeted number of signal electrons;

wherein the first targeted number of signal electrons equals zero;

the second targeted number of signal electrons is larger than the desired number of signal electrons.

58. The method of claim 57 wherein the sensor is an EBCCD sensor.

59. The method of claim 57 wherein the measuring, the processing, the associating, the retrieving and the adjusting are performed within a time period equal to or shorter than 200 µs.

60. The method of claim 57 wherein the predetermined number of consecutive times is equal to or higher than 50.

61. The method of claim 57, wherein the sensor bias is the control bias, the acceleration bias, or a combination of the control bias and the acceleration bias.

62. The method of claim 51, wherein at the second retrieved voltage value, the sensor gain has a substantially linear relationship with the sensor bias.

63. The method of claim 61, wherein the first retrieved voltage value is equal to or smaller than a cutoff voltage for the sensor bias at the onset of a cutoff region of the sensor.

64. A method of operating an electron bombarded charge coupled device, the method comprising:

receiving one or more photons at a first intensity level;

generating a plurality of electron particles based upon an intensity of the one or more photons;

capturing the plurality of electrons using an array of pixel elements, each of the pixel elements being configured in a pixel spatial orientation to capture a pattern in a pixel domain provided by the plurality of electrons;

converting the captured pattern in the pixel domain into a resulting captured pattern, the resulting captured pattern being associated with an spatial image of one or more received photons;

processing the resulting captured pattern and determining a measured number of signal electrons based on at least information associated with the resulting captured pattern;

associating the measured number of signal electrons with a desired range for number the of signal electrons;

if the measured number of signal electrons is outside the desired range for the number of signal electrons, retrieving a voltage value for a sensor bias from a memory system and adjusting the sensor bias to the retrieved voltage value, the voltage value corresponding to a targeted number of signal electrons.

* * * * *